(12) United States Patent
Liao et al.

(10) Patent No.: US 11,227,978 B2
(45) Date of Patent: Jan. 18, 2022

(54) SEMICONDUCTOR DEVICE AND PACKAGE STRUCTURE

(71) Applicant: EPISTAR CORPORATION, Hsinchu (TW)

(72) Inventors: Wen-Luh Liao, Hsinchu (TW); Cheng-Long Yeh, Hsinchu (TW); Ko-Yin Lai, Hsinchu (TW); Yao-Ru Chang, Hsinchu (TW); Yung-Fu Chang, Hsinchu (TW); Yi Hsiao, Hsinchu (TW); Shih-Chang Lee, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 16/680,214

(22) Filed: Nov. 11, 2019

(65) Prior Publication Data
US 2020/0152836 A1     May 14, 2020

Related U.S. Application Data

(60) Provisional application No. 62/759,973, filed on Nov. 12, 2018.

(30) Foreign Application Priority Data

Jun. 4, 2019   (TW) .................................. 108119308

(51) Int. Cl.
*H01L 33/62*      (2010.01)
*H01L 33/38*      (2010.01)

(52) U.S. Cl.
CPC .......... *H01L 33/387* (2013.01); *H01L 33/382* (2013.01); *H01L 33/62* (2013.01)

(58) Field of Classification Search
CPC combination set(s) only.
See application file for complete search history.

(56) References Cited

U.S. PATENT DOCUMENTS

| | | | |
|---|---|---|---|
| 9,331,239 B1* | 5/2016 | Lin ......................... | H01L 33/06 |
| 10,043,947 B2 | 8/2018 | Ko et al. | |
| 10,156,335 B1* | 12/2018 | Li ............................ | F21S 43/14 |
| 2015/0048304 A1* | 2/2015 | Niwa ................... | H01L 33/0095 257/13 |
| 2016/0240731 A1* | 8/2016 | Peng ........................ | H01L 33/46 |
| 2018/0277590 A1* | 9/2018 | Chung .................... | H01L 33/30 |

* cited by examiner

*Primary Examiner* — Moin M Rahman
(74) *Attorney, Agent, or Firm* — Ditthavong, Steiner & Mlotkowski

(57) ABSTRACT

A semiconductor device and a package structure are provided. The semiconductor device includes a substrate, a light-emitting structure, a first semiconductor layer, a second semiconductor layer and a first electrode. The light-emitting structure is on the substrate. The first semiconductor layer is on the light-emitting structure. The second semiconductor layer is between the first semiconductor layer and the light-emitting structure. The first electrode is on the second semiconductor layer. At least a portion of the first electrode is separated from the first semiconductor layer.

19 Claims, 16 Drawing Sheets

20

SEMICONDUCTOR DEVICE AND PACKAGE STRUCTURE

CROSS REFERENCE TO RELATED APPLICATIONS

This application claims the right of priority based on U.S. provisional patent application Ser. No. 62/759,973, filed on Nov. 12, 2018 and TW application Serial No. 108119308, filed on Jun. 4, 2019, which also claims the benefit of U.S. provisional patent application Ser. No. 62/759,973, and each of which is incorporated by reference herein in its entirety.

FIELD OF DISCLOSURE

The present disclosure relates to a semiconductor device and a semiconductor package structure.

BACKGROUND OF THE DISCLOSURE

In technical fields, such as information transfer and energy transformation, semiconductor devices play important roles. Various researches and developments of related material used in the semiconductor devices have been conducted. For example, a III-V group semiconductor material containing a III-group element and a V-group element can be applied to various optoelectronic devices, such as light emitting diodes (LEDs), laser diodes (LDs) or solar cells. In recent years, the optoelectronic devices are widely applied in fields including lighting, display, communication, sensing and power supply system. The light emitting diodes may be used as a solid-state lighting source and have many advantages, for example, low energy consumption and long operating lifetime. Therefore, the light emitting diodes have been taken place of traditional light sources and widely applied in traffic signs, backlight modules of displays, lighting or medical devices.

SUMMARY OF THE DISCLOSURE

The present disclosure provides a semiconductor device. The semiconductor device includes a substrate, a light-emitting structure, a first semiconductor layer, a second semiconductor layer and a first electrode. The light-emitting structure is on the substrate. The first semiconductor layer is on the light-emitting structure. The second semiconductor layer is between the first semiconductor layer and the light-emitting structure. The first electrode is on the second semiconductor layer. At least a portion of the first electrode is separated from the first semiconductor layer.

The present disclosure further provides a semiconductor package structure. The semiconductor package structure includes a carrier, a cover plate on the carrier, a semiconductor device, a first electrode and a package material. The semiconductor device is between the carrier and the cover plate. The semiconductor device includes a substrate, a light-emitting structure on the substrate, a first semiconductor layer on the light-emitting structure, and a second semiconductor layer between the first semiconductor layer and the light-emitting structure. The first electrode is on the second semiconductor layer. At least a portion of the first electrode is separated from the first semiconductor layer. The package material filled between the carrier, the semiconductor device and the cover plate.

The present disclosure further provides a semiconductor package structure which includes a carrier, a cover plate on the carrier, a first semiconductor device, a second semiconductor device, and a package material. The first semiconductor device and the second semiconductor device are located between the carrier and the cover plate. The package material is filled between the carrier, the first semiconductor device, the second semiconductor device and the cover plate. The first semiconductor device is the semiconductor device mentioned above. The second semiconductor device is an optical detector.

DETAILED DESCRIPTION OF THE DISCLOSURE

Figure 1A:
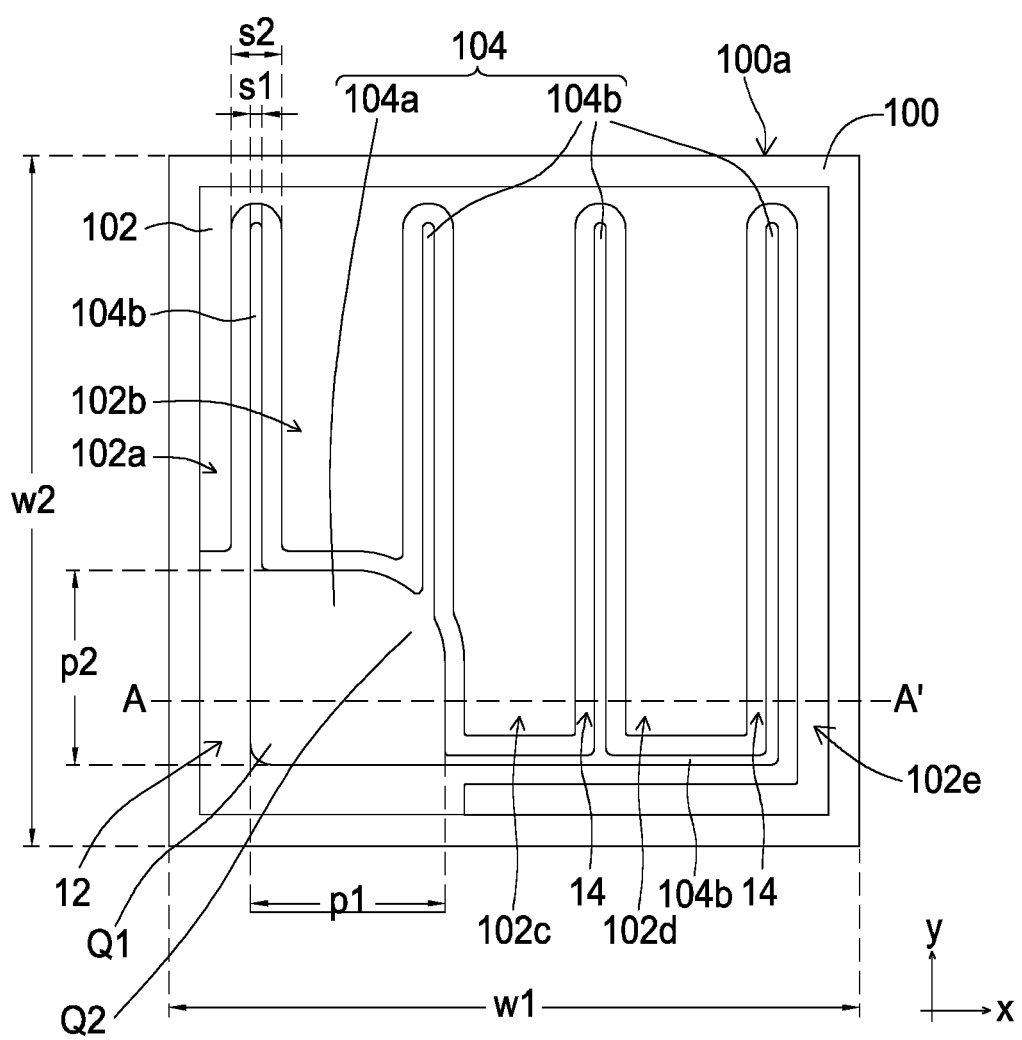
FIG. 1A shows a schematic top view of a semiconductor device in accordance with an embodiment of the present disclosure.

The following embodiments will be described with accompany drawings to disclose the concept of the present disclosure. In the drawings or description, same or similar portions are indicated with same numerals. Furthermore, a shape or a thickness of a component in the drawings may be enlarged or reduced. Particularly, it should be noted that a component which is not illustrated or described in drawings or description may be in a form that is known by a person skilled in the art.

In the present disclosure, if not otherwise specified, the general formula InGaP represents $In_{x1}Ga_{1-x1}P$, wherein $0<x1<1$; the general formula InGaAsP represents $In_{x2}Ga_{1-x2}As_{y2}P_{1-y2}$, wherein $0<x2<1$, and $0<y2<1$; the general formula InGaAs represents $In_{x3}Ga_{1-x3}As$, wherein $0<x3<1$; the general formula AlGaAs represents $Al_{x4}Ga_{1-x4}As$, wherein $0<x4<1$; the general formula AlGaInAs represents $Al_{x5}Ga_{x6}In_{1-x5-x6}As$, wherein $0<x5<1$, $0<x6<1$; the general formula InGaNAs represents $In_{x7}Ga_{1-x7}N_{x8}As_{1-x8}$, wherein $0<x7<1$, and $0<x8<1$. The content of each element may be adjusted for different purposes, for example, for adjusting the energy gap, or when the semiconductor device is a light-emitting device, the peak wavelength or dominant wavelength may be adjusted. However, the present disclosure is not limited thereto.

A person skilled in the art can realize that addition of other components based on a structure recited in the following embodiments is allowable. For example, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations. Furthermore, in the present disclosure, a description of "a layer/structure only includes X material" means the X material is the only composition of the layer/structure; however, the layer/structure may still contain a dopant or unavoidable impurities.

Qualitative or quantitative analysis of the composition and/or dopant contained in each layer of the semiconductor device of the present disclosure may be conducted by any suitable methods, for example, a secondary ion mass spectrometer (SIMS). A thickness of each layer may be obtained by any suitable methods, such as a transmission electron microscopy (TEM) or a scanning electron microscope (SEM).

Figure 1B:
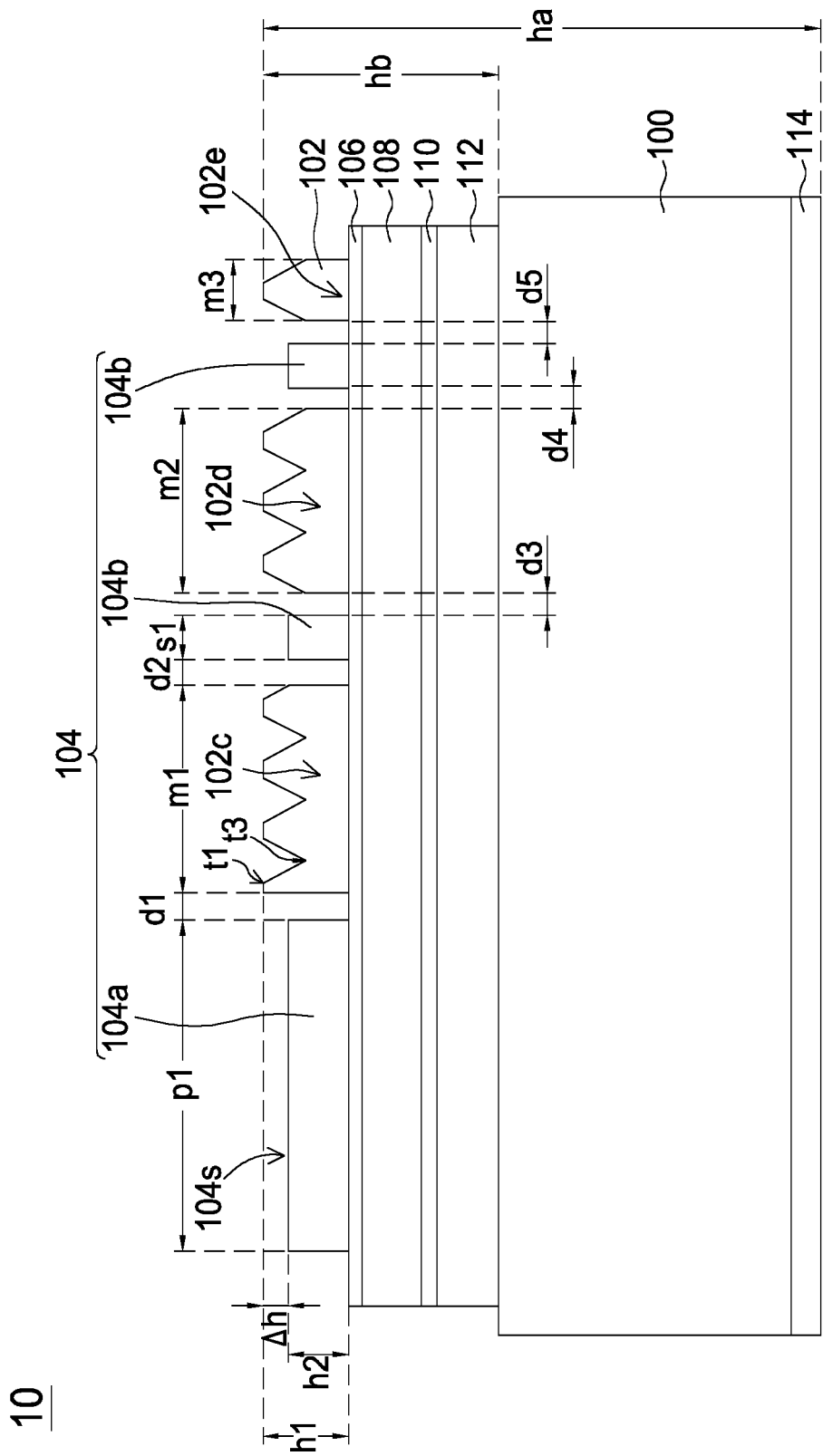
FIG. 1B shows a schematic sectional view of the semiconductor device along A-A' line in FIG. 1A.

FIG. 1A shows a schematic top view of a semiconductor device 10 in accordance with an embodiment. FIG. 1B shows a schematic sectional view of the semiconductor device 10 along A-A' line in FIG. 1A.

In the schematic top view, the semiconductor device 10 has a rectangular shape. The semiconductor device 10 has a width w1 in an x-direction and a width w2 in a y-direction. In an embodiment, 200 μm≤w1≤800 μm. The width w1 is, for example, 250 μm, 300 μm, 350 μm, 400 μm, 450 μm, 500 μm, 600 μm or 700 μm. In an embodiment, 200 μm≤w2≤800 μm. The width w2 is, for example, 250 μm, 300 μm, 350 μm, 450 μm, 500 μm, 600 μm or 700 μm. In an embodiment, the width w1 and the width w2 may be approximately the same (that is, the semiconductor device 10 has a square shape in the top view).

As shown in FIG. 1A and FIG. 1B, the semiconductor device 10 includes a substrate 100, a first semiconductor layer 102, a second semiconductor layer 106, a third semiconductor layer 108, a light-emitting structure 110, and a fourth semiconductor layer 112. The first semiconductor layer 102, the second semiconductor layer 106, the third semiconductor layer 108, the light-emitting structure 110, and the fourth semiconductor layer 112 can be obtained by epitaxial growth. The method for epitaxial growth includes metal-organic chemical vapor deposition (MOCVD), hydride vapor phase epitaxy (HVPE), molecular beam epitaxy (MBE) or liquid-phase epitaxy (LPE). The semiconductor device 10 of the embodiment is a vertical device, which includes a first electrode 104 on a side of the substrate 100, and a second electrode 114 on another side of the substrate 100. The first electrode 104 and the second electrode 114 can be electrically connected to the light-emitting structure 110.

The substrate 100 may be made of a conductive material, such as gallium arsenide (GaAs), indium phosphide (InP), silicon carbide (SiC), or Si. The substrate 100 may be a growth substrate for the epitaxial growth. In an embodiment, the substrate 100 may be a support substrate bonding to an epitaxial structure through a bonding structure after removing the growth substrate.

The light-emitting structure 110 is on the substrate 100. The light-emitting structure 110 may include a single heterostructure (SH), a double heterostructure (DH), a double-side double heterostructure (DDH) or a multiple quantum wells (MQW). The light-emitting structure 110 may include a III-V group semiconductor material, and preferably include Al, Ga, As, P, In or N. In an embodiment, the light-emitting structure 110 may not contain N. During operation of the semiconductor device 10, the light-emitting structure 110 may radiate. The radiation can be a red light or an infrared light, for example, a near-infrared (NIR) light. When the radiation is a near-infrared light, it may have a peak wavelength in a range of 800 nm to 3000 nm, for example, approximately 810 nm, 850 nm, 910 nm, 940 nm, 1050 nm, 1070 nm, 1100 nm, 1200 nm, 1300 nm, 1400 nm, 1450 nm, 1550 nm, 1600 nm, 1650 nm, or 1700 nm. In some embodiments, the light-emitting structure 110 may include a ternary or a quaternary semiconductor material, such as InGaAs, InGaAsP, AlGaInAs or InGaNAs. In some embodiments, the light-emitting structure 110 only includes the quaternary semiconductor material (such as InGaAsP, AlGaInAs or InGaNAs).

The third semiconductor layer 108 and the fourth semiconductor layer 112 are respectively located on two sides of the light-emitting structure 110. Both the third semiconductor layer 108 and the fourth semiconductor layer 112 can be in physical contact with the light-emitting structure 110. The third semiconductor layer 108 and the fourth semiconductor layer 112 are of different conductivity types. The third semiconductor layer 108 and the fourth semiconductor layer 112 may be an n-type semiconductor and a p-type semiconductor, respectively, so as to provide electrons and holes. In an embodiment, the third semiconductor layer 108 is a p-type semiconductor and the fourth semiconductor layer 112 is an n-type semiconductor. The third semiconductor layer 108 and the fourth semiconductor layer 112 may respectively include a binary, ternary or quaternary semiconductor material such as a III-V group semiconductor material, and preferably contain Al, Ga, As, P, In, or N. In an embodiment, the third semiconductor layer 108 and/or the fourth semiconductor layer 112 may not contain N. The ternary semiconductor material is, for example, InGaAs, InGaP or AlGaAs. In some embodiments, the third semiconductor layer 108 or the fourth semiconductor layer 112 only include ternary semiconductor material (such as InGaAs, InGaP or AlGaAs). In an embodiment, the material of the third semiconductor layer 108 and the material of the fourth semiconductor layer 112 contain at least two same elements. For example, the third semiconductor layer 108 and the fourth semiconductor layer 112 may both include Ga and As. In another embodiment, the material of the third semiconductor layer 108 and the material of the fourth semiconductor layer 112 are the same. For example, the material of the third semiconductor layer 108 and the material of the fourth semiconductor layer 112 are both AlGaAs. In addition, conductivity types of the third semiconductor layer 108 and the fourth semiconductor layer 112 may be adjusted by doping different dopants, such as Mg, Zn, C, Si, or Te.

The second semiconductor layer 106 is on the third semiconductor layer 108 and can be served as an electrical contact layer for conducting a current. When the first electrode 104 includes metal, an ohmic contact may be formed between the second semiconductor layer 106 and the first electrode 104. The second semiconductor layer 106 and the third semiconductor layer 108 may have the same conductivity type, for example, n-type. A thickness of the second semiconductor layer 106 may be in a range of 15 µm to 80 µm, for example, approximately 30 µm, 40 µm, 50 µm, 60 µm, or 70 µm. The second semiconductor layer 106 may include a binary, ternary or quaternary semiconductor material such as a III-V group semiconductor material, and preferably contain Al, Ga, As, P, In or N. In an embodiment, the second semiconductor layer 106 may not contain N. The ternary semiconductor material is, for example, InGaAs, InGaP or AlGaAs. In some embodiments, the second semiconductor layer 106 only includes the ternary semiconductor material, such as InGaAs, InGaP or AlGaAs. In an embodiment, the second semiconductor layer 106 includes $Al_yGa_{1-y}As$, wherein $0.05 \leq y \leq 0.1$, for example, 0.06, 0.07, 0.08, or 0.09. In addition, the second semiconductor layer 106 may include a dopant, such as Si or Te. In an embodiment, when the second semiconductor layer 106 contains Al content and/or a dopant as mentioned above, a light transmission rate may be further elevated and light absorption may be reduced, contact characteristics between the second semiconductor layer 106 and the first electrode 104 may be optimized, and a light-emitting power (which may be indicated in mW) of the semiconductor device may be improved.

The first semiconductor layer 102 is on the second semiconductor layer 106 and may physically contact the second semiconductor layer 106. The first semiconductor layer 102 may have the same conductivity type (e.g. n-type or p-type) as that of the second semiconductor layer 106 or the third semiconductor layer 108. The first semiconductor layer 102 may be served as a light extraction layer (or window layer) for further elevating the light-emitting power of the semiconductor device. In an embodiment, the first semiconductor layer 102 is preferably a roughened upper surface formed by a roughening process. The roughening process includes wet etching or dry etching (for example, an inductively coupled plasma (ICP) etching). The first semiconductor layer 102 may include a binary, ternary or quaternary semiconductor material such as a III-V group semiconductor material, and preferably contains Al, Ga, As, P, In or N. In an embodiment, the first semiconductor layer 102 may not contain N. The ternary semiconductor material may include InGaAs, InGaP, or AlGaAs. In some embodiments, the first semiconductor layer 102 only includes the ternary semiconductor material, such as InGaAs, InGaP, or AlGaAs.

In this embodiment, the first electrode 104 is on the second semiconductor layer 106 and physically contacts an upper surface of the second semiconductor layer 106. The first electrode 104 may include a main electrode 104a and an extension electrode 104b. There may be a plurality of extension electrodes 104b. The number of the extension electrodes 104b may be more than or equal to 2 and less than or equal to 15. In this embodiment, the first electrode 104 includes four extension electrodes 104b approximately parallel to the y-direction and one extension electrode 104b approximately parallel to the x-direction.

In this embodiment, the first semiconductor layer 102 includes a first part 102a, a second part 102b, a third part 102c, a fourth part 102d and a fifth part 102e. As shown in the top view of FIG. 1A, the first part 102a, the second part 102b, the third part 102c, the fourth part 102d and the fifth part 102e are connected to each other near a side 100a of the substrate 100 and respectively extend along a direction parallel to the y-direction, while in the sectional view along A-A' line as shown in FIG. 1B, the first part 102a, the second part 102b, the third part 102c, the fourth part 102d and the fifth part 102e are separated from each other. In the embodiment, two extension electrodes 104b are respectively located between the third part 102c and the fourth part 102d and between the fourth part 102d and the fifth part 102e. In the sectional view, the third part 102c may have a width m1 less than the width p1 or the width p2 of the main electrode 104a, and the width m1 may be larger than the width s1. The fourth part 102d may have a width m2 approximately the same as the width m1. The fifth part 102e may have a width m3 smaller than the width m1 or the width m2.

In this embodiment, the first electrode 104 does not physically contact the first semiconductor layer 102. As shown in FIG. 1B, the main electrode 104a of the first electrode 104 is separated from the third part 102c by a distance d1, and an extension electrode 104b between the third part 102c and the fourth part 102d is separated from the third part 102c by a distance d2 and separated from the fourth part 102d by a distance d3. An extension electrode 104b between the fourth part 102d and the fifth part 102e is separated from the third part 102e by a distance d4 and separated from the fifth part 102d by a distance d5. The distances d1, d2, d3, d4 and d5 may be the same or different. In an embodiment, the distances d1, d2, d3, d4 and d5 are respectively in a range of 1 µm to 15 µm, such as 3 µm, 5 µm, 10 µm, or 12 µm. In an embodiment, the distance d1 and the distance d2 are approximately the same. In an embodiment, the distance d2 and the distance d3 are approximately the same. In an embodiment, the distance d3 and the distance d4 are approximately the same. In an embodiment, the distance d4 and the distance d5 are approximately the same. Since the first electrode 104 is separated from the first semiconductor layer 102, current leakage during operation of the semiconductor device may be avoided, and the process stability in production of the semiconductor device may be elevated. Optionally, an insulating layer (not shown) can be further formed between the first electrode 104 and the first semiconductor layer 102 to avoid the current leakage.

In the top view, the semiconductor device 10 has a rectangular shape, and the main electrode 104a is located near a corner of the rectangular shape with a distance from an edge (i.e. a side of the rectangular shape) of the semiconductor device 10. This arrangement may be advantageous in performing subsequent processes, for example, wire bonding, and current leakage may also be prevented. In this embodiment, an outer profile of the substrate 100 forms four sides of the rectangular shape. In the top view, the main electrode 104a may have a polygonal shape with a round corner, for example, a quadrangular shape having a round corner and a square corner at the same time. The electrostatic discharge (ESD) protection effect of the device may be enhanced by the main electrode 104a having the round corner. In this embodiment, the main electrode 104a has a first round corner Q1 and a second round corner Q2. The first round corner Q1 is closer to the edge of the semiconductor device 10 than the second round corner Q2. The second round corner Q2 may physically connect one of the extension electrodes 104b. The first round corner Q1 and the second round corner Q2 may have different corner radii, for example, the first round corner Q1 may have a corner radius less than the corner radius of the second round corner Q2. In another embodiment, the corner radius of the first round corner Q1 can be larger than or equal to the corner radius of the second round corner Q2. In this embodiment, except the first round corner Q1 and the second round corner Q2, the other two corners of the main electrode 104a are square corners, and each square corner may physically connect to one of the extension electrodes 104b. Furthermore, the main electrode 104a has a width p1 in the x-direction, and a width p2 in the y-direction. In an embodiment, 50 µm≤p1≤200 µm. The width p1 is, for example, 80 µm, 100 µm, 120 µm, 150 µm, or 180 µm. In an embodiment, 50 µm≤p2≤200 µm. The width p2 is, for example, 80 µm, 100 µm, 120 µm, 150 µm, or 180 µm. In an embodiment, the width p1 and the width p2 are approximately the same.

In this embodiment, a notch 12 and a plurality of grooves 14 are formed in the first semiconductor layer 102 so that the second semiconductor layer 106 under the first semiconductor layer 102 may be exposed. In the embodiment, the main electrode 104a is formed in the notch 12 on a portion of second semiconductor layer 106, and the extension electrodes 104b is formed in the grooves 14 on a portion of second semiconductor layer 106. Each extension electrode 104b has a width s1, and each groove has a width s2 larger than the width s1. In an embodiment, 1 µm≤s1≤10 µm, and 15 µm≤s2≤50 µm. The width s2 is preferably 1.5 times or more than the width s1, for example, 2 times or more or 3 times or more. The width s2 is preferably 10 times or less than the width s1, for example, 8 times or less or 5 times or less. The width s1 may be 2 µm, 4 µm, 6 µm or 8 µm, and the width s2 may be 20 µm, 26 µm, 32 µm, or 40 µm. In an embodiment, the extension electrodes 104b may have different widths. In an embodiment, at least one of the extension electrodes 104b has a width s1 gradually decreased from one end to another end. For example, at least one of the extension electrodes 104b may have a width gradually decreased from the end closer to the main electrode 104a to the end away from the main electrode 104a, so that at least one of the extension electrodes 104b has a varied width. In an embodiment, the extension electrode(s) having a varied width may be an electrode approximately parallel to the x-direction and/or an electrode approximately parallel to the y-direction.

Specifically, the first electrode 104 and the second electrode 114 may be electrically connected to an external power supply. The first electrode 104 and the second electrode 114 may contain a conductive material. The material of the first electrode 104 and the material of the second electrode 114 may be the same or different, and may respectively include metal oxide, metal or alloy. The metal oxide may include ITO, InO, SnO, CTO, ATO, AZO, ZTO, GZO, IWO, ZnO, or IZO. The metal may include Ge, Be, Zn, Au, Pt, Ti, Al, Ni, or Cu. The alloy may include at least two metal elements selected from the above-mentioned metal elements. For example, the alloy may be GeAuNi, BeAu, GeAu or ZnAu.

The first semiconductor layer 102 may have a first end portion t1, and the first electrode 104 may have an upper surface 104s lower than the first end portion t1. In this embodiment, the first semiconductor layer 102 has a height h1, and the first electrode 104 has a height h2. The height difference Δh between the height h1 and the height h2 (Δh=h1−h2) fulfills 0≤Δh≤2 µm. The height difference Δh is, for example, 0.1 µm, 0.2 µm, 0.3 µm, 0.5 µm, 0.6 µm, 0.8 µm or 1 µm. When the height of the upper surface of the first electrode 104 is lower than or equal to the end portion of the first semiconductor layer 102, it is easier to integrate the semiconductor device 10 into a package structure with a smaller size since an overall height of the semiconductor device 10 can be further reduced, which is beneficial to device miniaturization.

Figure 1C:
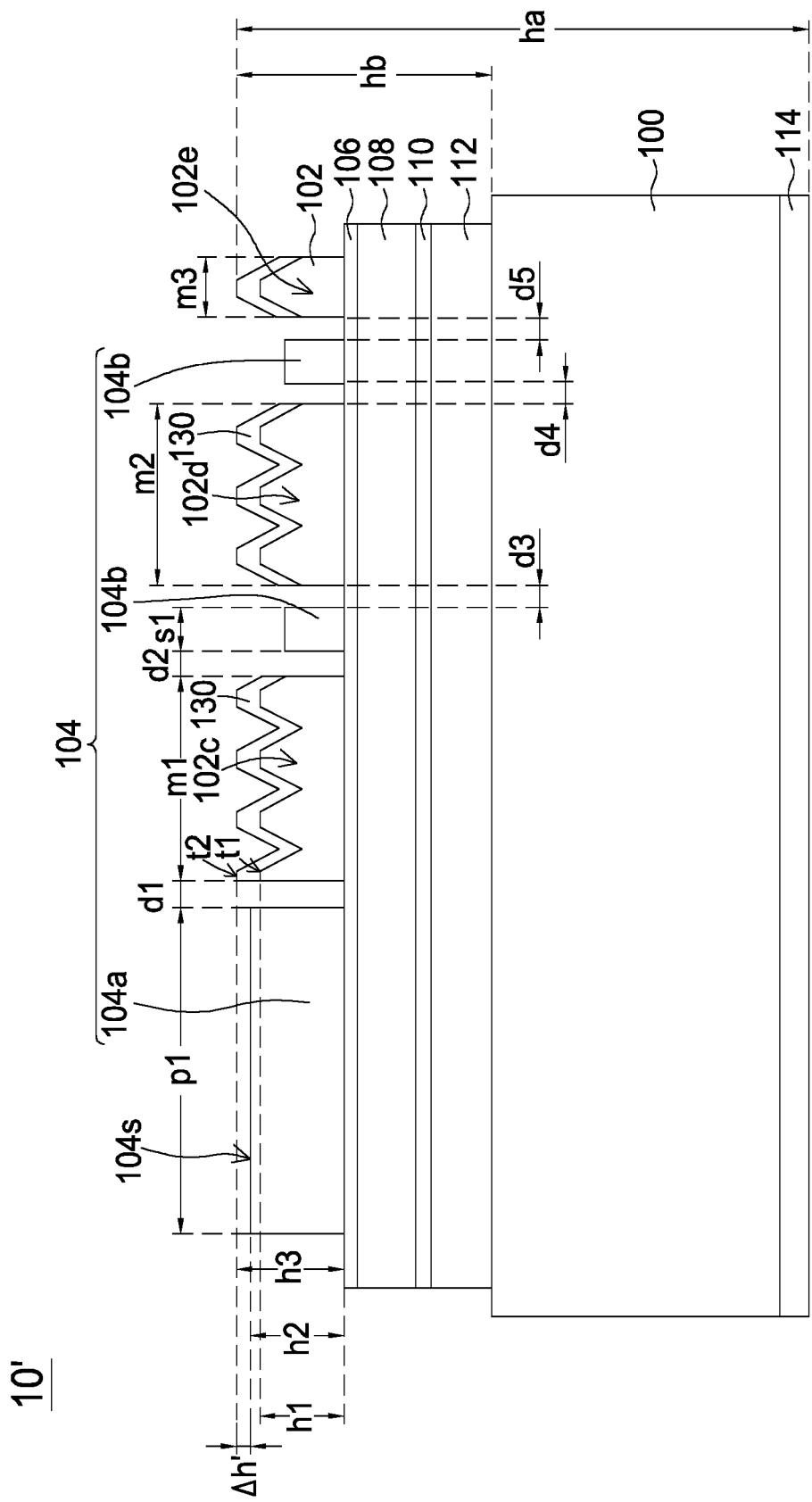
FIG. 1C shows a schematic sectional view of a semiconductor device in accordance with another embodiment of the present disclosure.

FIG. 1C shows a schematic sectional view of a semiconductor device 10' in accordance with another embodiment. In this embodiment, a cover layer 130 is further formed on the first semiconductor layer 102. The cover layer 130 may be conformably formed on the first semiconductor layer 102. The upper surface 104s of the first electrode 104 may be higher than the first end portion t1 but lower than an upper edge t2 of the cover layer 130. As shown in FIG. 1C, the height h1 of the first semiconductor layer 102 may be less than the height h2 of the first electrode 104. The first semiconductor layer 102 and the cover layer 130 may have an overall height h3, and the height difference Δh' (Δh'=h3−h2) between the overall height h3 and the height h2 fulfills 0≤Δh'≤2 µm. The height difference Δh' is, for example, 0.1 µm, 0.2 µm, 0.3 µm, 0.5 µm, 0.6 µm, 0.8 µm, or 1 µm. Accordingly, it is also easy to integrate the semiconductor device 10 into the package structure. In an embodiment, the cover layer 130 may be a metal oxide layer which includes metal oxide, such as ITO, InO, SnO, CTO, ATO, AZO, ZTO, GZO, IWO, ZnO, or IZO.

The semiconductor device 10 has an overall height ha, and the epitaxial structure in the semiconductor device 10 has a height hb. In an embodiment, 100 µm≤ha≤250 µm, and 3 µm≤hb≤10 µm. To be more specific, the height ha is 130 µm, 150 µm, 170 µm, 200 µm, or 230 µm, and the height hb is 5 µm or 8 µm. Furthermore, in an embodiment, a surface of the first semiconductor layer 102 can be a roughened surface. In a sectional view of the semiconductor device 10, the upper surface 104s of the first electrode 104 may be higher than the lowest point of the roughened surface (for example, the position t3 as shown in FIG. 1B). Or, in a sectional view of the semiconductor device 10, the upper surface 104s of the first electrode 104 may be lower than the lowest point of the roughened surface (for example, the position t3 as shown in FIG. 1B).

In some embodiments, a portion of the extension electrode 104b may physically connect to the first semiconductor layer 102, as described in the following embodiments corresponding to FIG. 2A to FIG. 3C.

Figure 2A:
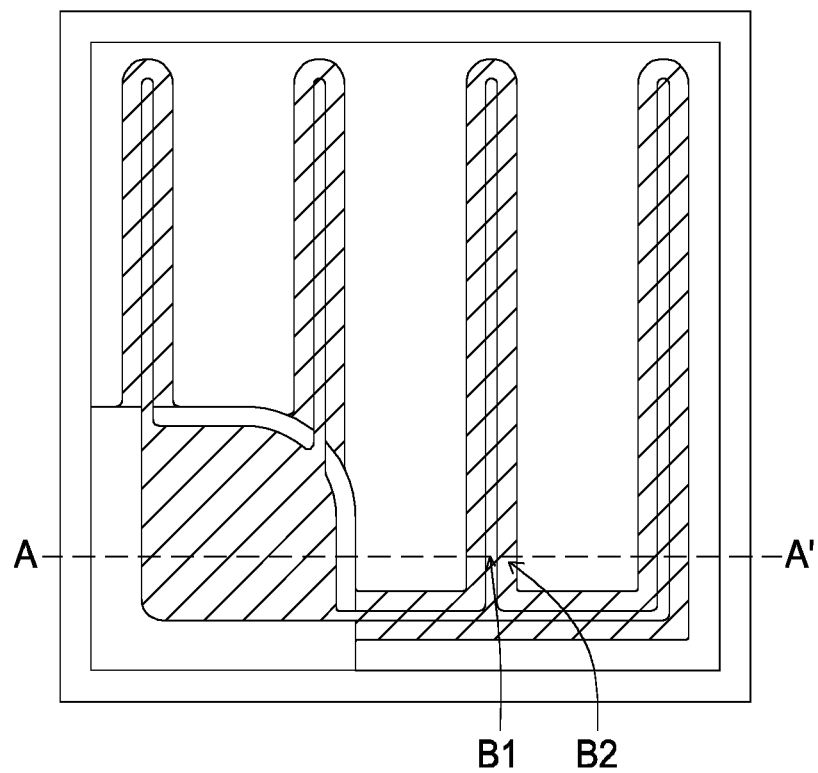
FIG. 2A shows a schematic top view of a semiconductor device in accordance with another embodiment of the present disclosure.
Figure 2B:
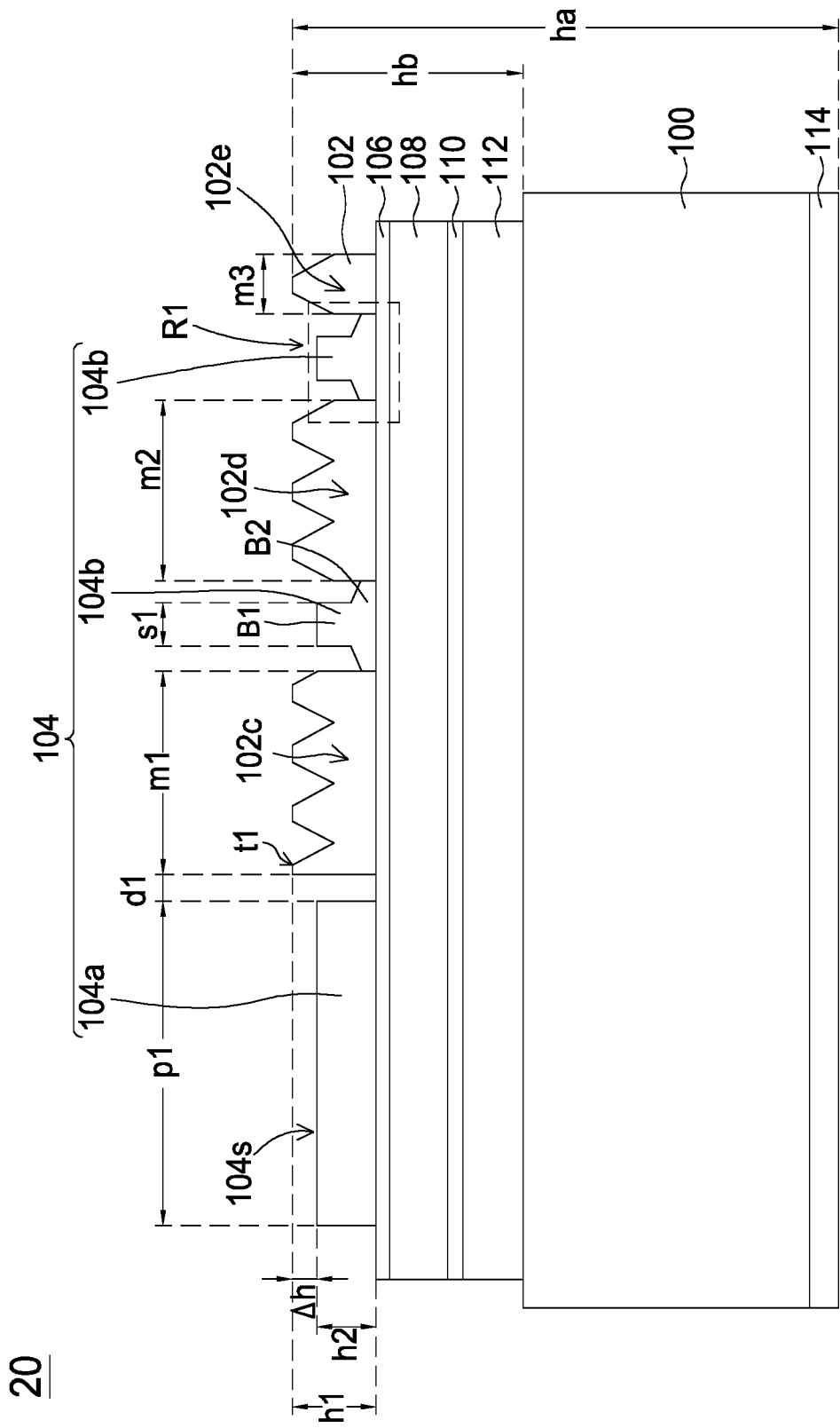
FIG. 2B shows a schematic sectional view of the semiconductor device along A-A' line in FIG. 2A.
Figure 2C:
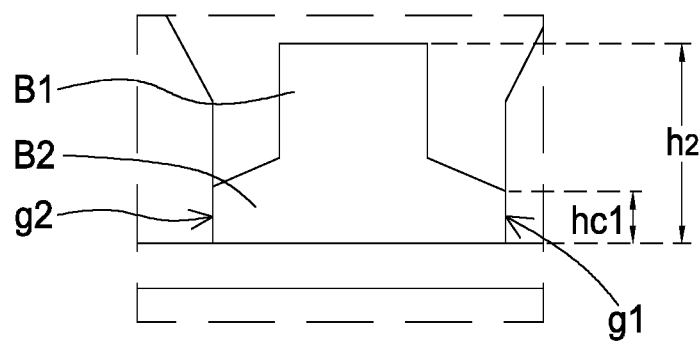
FIG. 2C shows a partial enlargement view of the semiconductor device in FIG. 2B.

FIG. 2A shows a schematic top view of a semiconductor device 20 in accordance with another embodiment. FIG. 2B shows a schematic sectional view of the semiconductor device 20 along A-A' line in FIG. 2A. FIG. 2C shows a partial enlargement view of a region R1 of the semiconductor device 20 in FIG. 2B.

As shown in FIG. 2A and FIG. 2B, the extension electrode 104b may have a first portion B1 and a second portion B2, and the second portion B2 is located between the first portion B1 and the second semiconductor layer 106. A part of the second portion B2 physically connects the first semiconductor layer 102, so as to expand the contact area between the extension electrode 104b and the first semiconductor layer 102 and to improve current spreading. In this embodiment, the second portion B2 has a side wall g1 and a side wall g2, and as shown in FIG. 2C, both the side wall g1 and the side wall g2 physically contact the first semiconductor layer 102. The first portion B1 and the second portion B2 may be respectively formed of a conductive material. In the top view of FIG. 2A, the main electrode 104a and the extension electrodes 104b of the first electrode 104 are marked by inclined hatching lines.

In some embodiments, a ratio of a height of the part of the extension electrode 104b which physically contacts the first semiconductor layer 102 (such as the height hc1 of the side wall g1 or the side wall g2 as shown in FIG. 2C) and the height of the extension electrode 104b (such as the height h2 as shown in FIG. 2C) may be controlled in a preferable range, for example, 1:3 or less, such that over distribution of electric current to the first semiconductor layer 102 caused by an oversized electrical contact area between the extension electrode 104b and the first semiconductor layer 102 can be avoided. Accordingly, the electric current spreading can be improved while avoiding current leakage. In this embodiment, a cross-sectional shape of the first portion B1 is approximately a rectangular shape, and the cross-sectional shape of the second portion B2 is approximately a polygonal shape.

In order to avoid redundancy, positions, compositions or material of other layers or structures in the embodiment that have already been mentioned in previous embodiments are not repeatedly described.

Figure 3A:
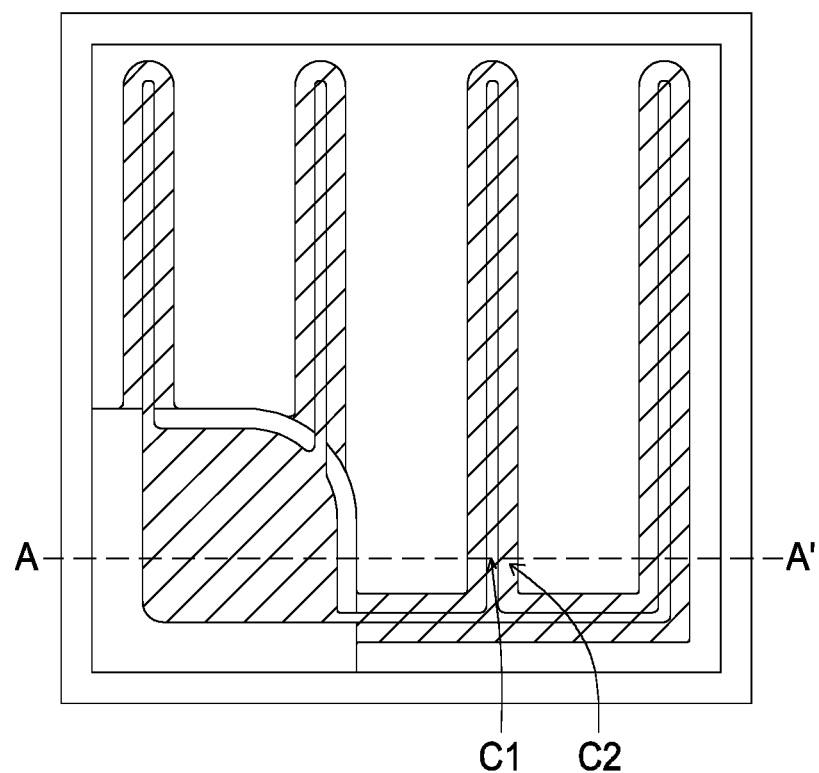
FIG. 3A shows a schematic top view of a semiconductor device in accordance with another embodiment of the present disclosure.
Figure 3B:
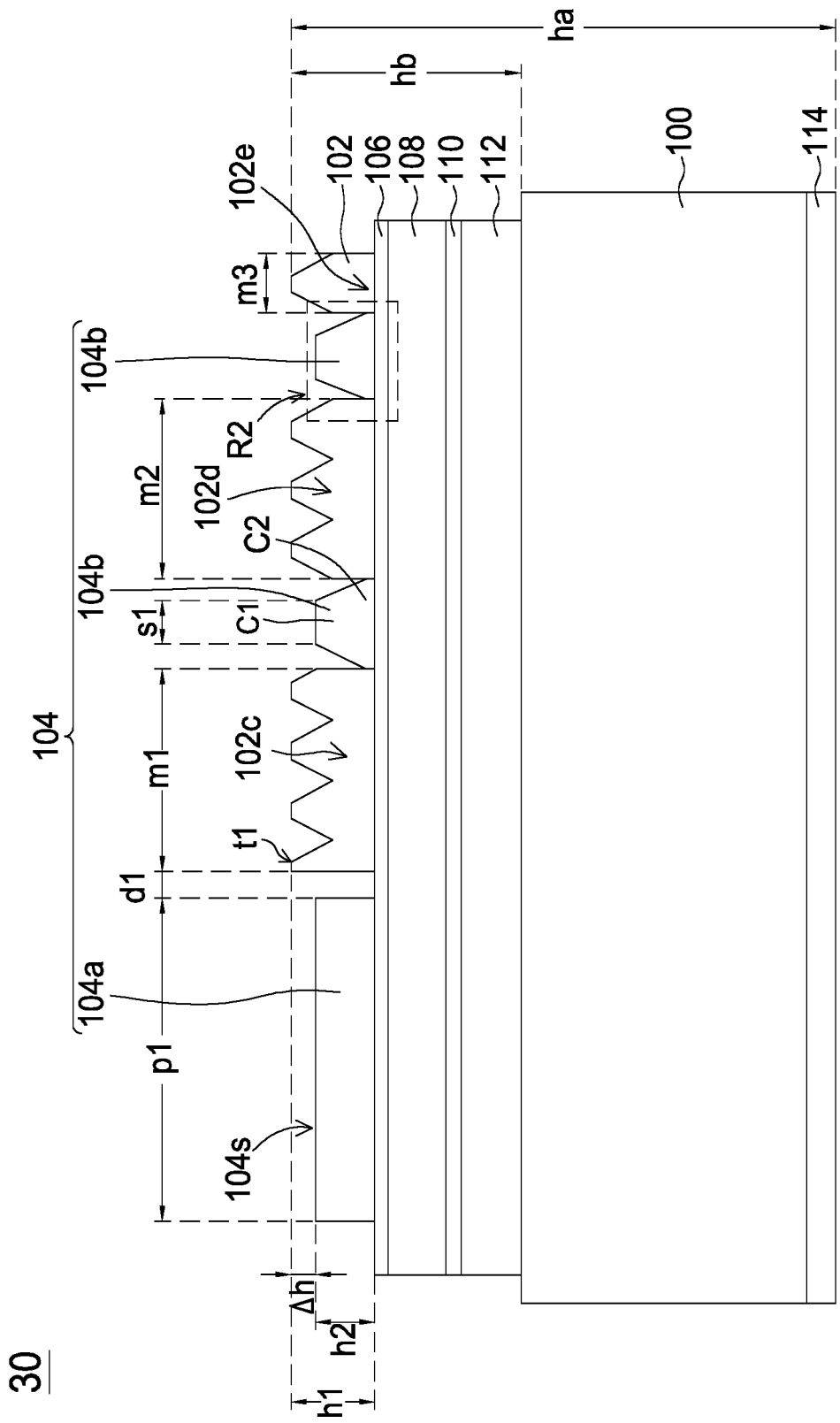
FIG. 3B shows a schematic sectional view of the semiconductor device along A-A' line in FIG. 3A.
Figure 3C:
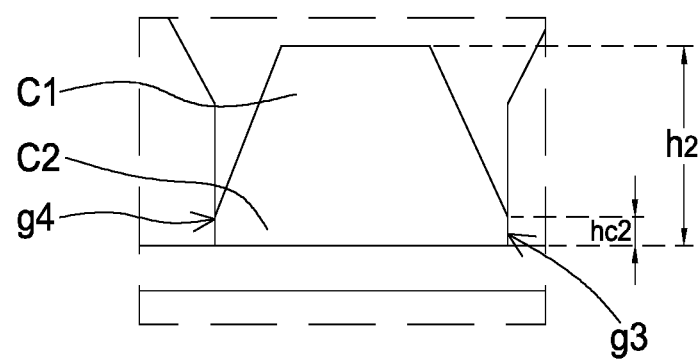
FIG. 3C shows a partial enlargement view of the semiconductor device in FIG. 3B.

FIG. 3A shows a schematic top view of a semiconductor device 30 in accordance with another embodiment. FIG. 3B shows a schematic sectional view of the semiconductor device 30 along A-A' line in FIG. 3A. FIG. 3C shows a partial enlargement view of a region R2 of the semiconductor device 30 in FIG. 3B.

In this embodiment, the extension electrode 104b has a first portion C1 and a second portion C2. A part of the second portion C2 physically connects the first semiconductor layer 102, so as to expand the contact area between the extension electrode 104b and the first semiconductor layer 102 and improve current spreading. As shown in FIG. 3C, the second portion C2 has a side wall g3 and a side wall g4, and both the side wall g3 and the side wall g4 physically contact the first semiconductor layer 102. In the top view of FIG. 3A, the main electrode 104a and the extension electrodes 104b of the first electrode 104 are marked by inclined hatching lines.

In addition, a ratio of a height of the part where the extension electrode 104b physically contacts the first semiconductor layer 102 (such as the height hc2 of the side wall g3 or the side wall g4 as shown in FIG. 3C) and the height of the extension electrode 104b (such as the height h2 in FIG. 3C) may be controlled in a preferable range, for example, 1:3 or less, such that over distribution of electric current to the first semiconductor layer 102 caused by oversized electrical contact area between the extension electrode 104b and the first semiconductor layer 102 can be avoided. Accordingly, the electric current spreading can be improved while avoiding current leakage. In this embodiment, the cross-sectional shape of the first portion C1 is approximately a trapezoidal shape, and the cross-sectional shape of the second portion C2 is approximately a rectangular shape.

In order to avoid redundancy, positions, compositions or material of other layers or structures in the embodiment that have already been mentioned in previous embodiments are not repeatedly described.

Figure 4A:
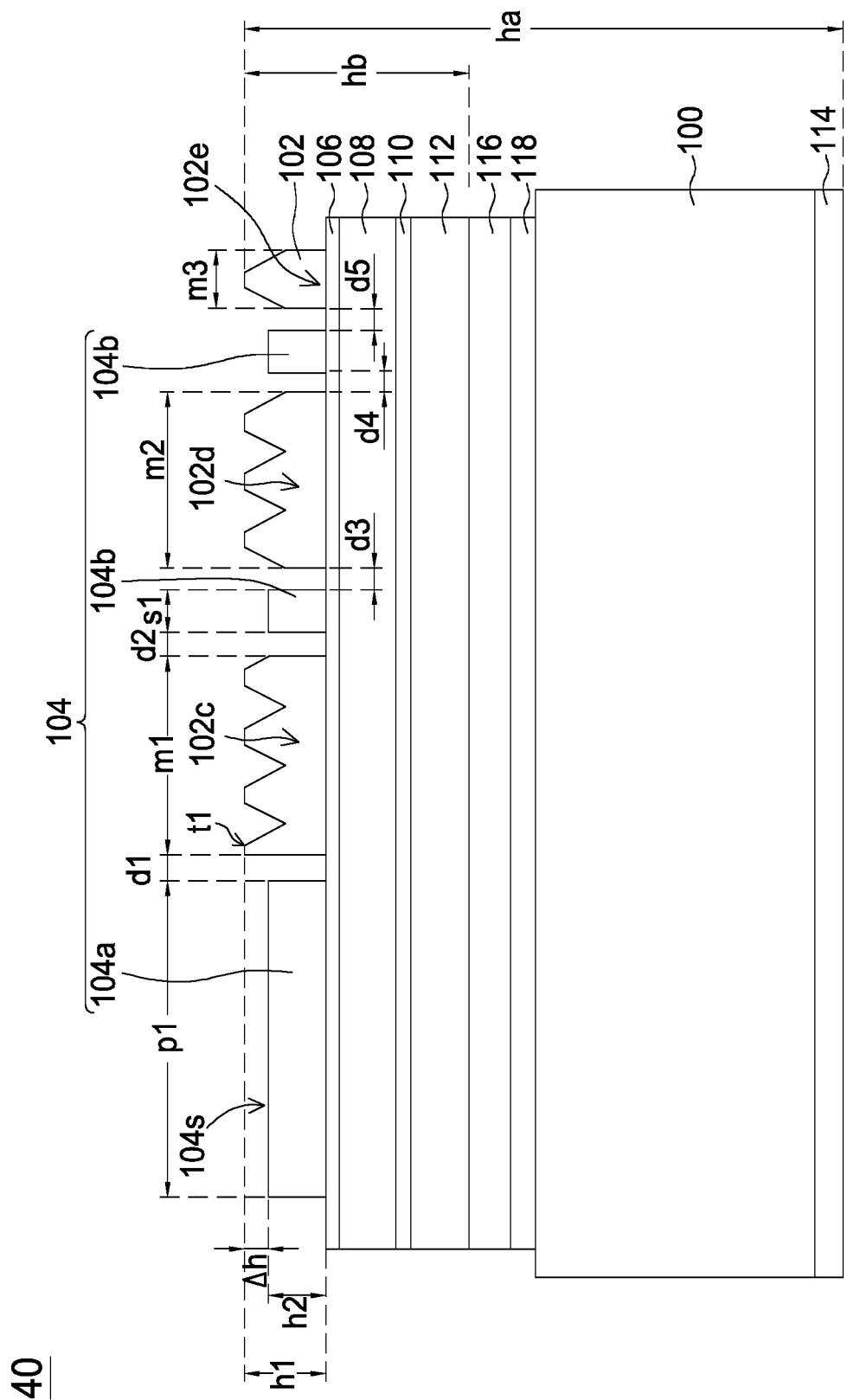
FIG. 4A shows a schematic sectional view of a semiconductor device in accordance with another embodiment of the present disclosure.

FIG. 4A shows a schematic sectional view of a semiconductor device 40 in accordance with another embodiment.

Figure 4B:
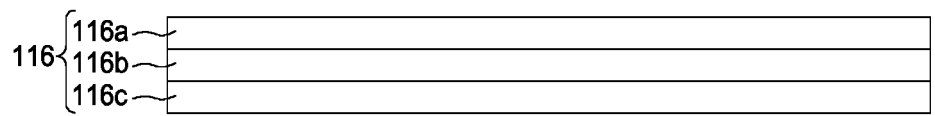
FIG. 4B shows a schematic sectional view of a reflective structure disclosed in accordance with an embodiment of the present disclosure.

FIG. 4B shows a schematic sectional view of a reflective structure 116 disclosed in accordance with an embodiment.

In this embodiment, the semiconductor device further includes a reflective structure 116 and a bonding structure 118 between the fourth semiconductor layer 112 and the substrate 100. The reflective structure 116 may include a single layer or multiple layers and may reflect the light emitted from the light-emitting structure 110 towards the first semiconductor layer 112 and exit out from the semiconductor device 40. The material of the reflective structure 118 may include metal or alloy. The metal may be Cu, Al, Sn, Au, Ag, Pb, Ti, Ni, Pt, or W. The alloy may include at least two metal elements selected from the above-mentioned metal elements. In an embodiment, the reflective structure 116 includes a distributed Bragg reflector (DBR) structure.

As shown in FIG. 4B, the reflective structure 116 may be conductive and may include a contact layer 116a, a transparent material layer 116b, and a reflective layer 116c. In an embodiment, the contact layer 116a is located under the fourth semiconductor layer 112, the transparent material layer 116b is located under the contact layer 116a, and the reflective layer 116c is located under the transparent material layer 116b. The contact layer 116a may contain a conductive material, for example, metal or metal oxide. The metal is, for example, Ag, Ge, Au, or Ni. The metal oxide may be ITO, InO, SnO, CTO, ATO, AZO, ZTO, GZO, IWO, ZnO, or IZO. The transparent material layer 116b may contain a conductive material such as metal oxide as mentioned above. The reflective layer 116c may contain a conductive material such as metal (e.g. Cu, Au, Ag, Ti, or Pt) or alloy thereof.

Figure 4C:
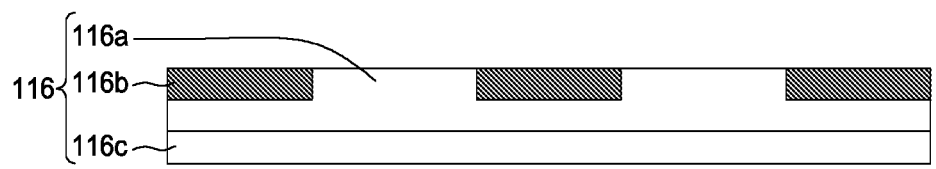
FIG. 4C shows a schematic sectional view of a reflective structure disclosed in accordance with another embodiment of the present disclosure.

As shown in FIG. 4C, in an embodiment, the transparent material layer 116b is patterned. The transparent material layer 116b may include an insulating material or a conductive material. The insulating material is, for example, a material having a refractive index less than 2, such as SiNx, AlOx, SiOx or MgFx. In an embodiment, x=1.5 or 2. The conductive material may include metal oxide as mentioned above.

The bonding structure 118 can connect the substrate 100 and the reflective structure 116. The bonding structure 118 may connect to the reflective layer 116c of the reflective structure 116. In an embodiment, the bonding structure 118 may include two or more sub-layers (not shown). The material of the bonding structure 118 may be conductive. The bonding structure 118 may include a transparent conductive material, metal or alloy. The transparent conductive material may include ITO, InO, SnO, CTO, ATO, AZO, ZTO, GZO, ZnO, GaP, ICO, IWO, ITiO, IZO, IGO, GAZO, graphene or a combination thereof. The metal may include Cu, Al, Sn, Au, Ag, Pb, Ti, Ni, Pt, or W. The alloy may include at least two metal elements selected from the above-mentioned metal elements.

In addition, a part of the extension electrode 104b in the semiconductor device 40 of the embodiment may also connect to the first semiconductor layer 102, and the above-mentioned embodiments corresponding to FIG. 2A to FIG. 3C can be referred to for details. In order to avoid redundancy, positions, compositions or material of other layers or structures in the embodiment that have already been mentioned in previous embodiments are not repeatedly described.

Figure 5A:
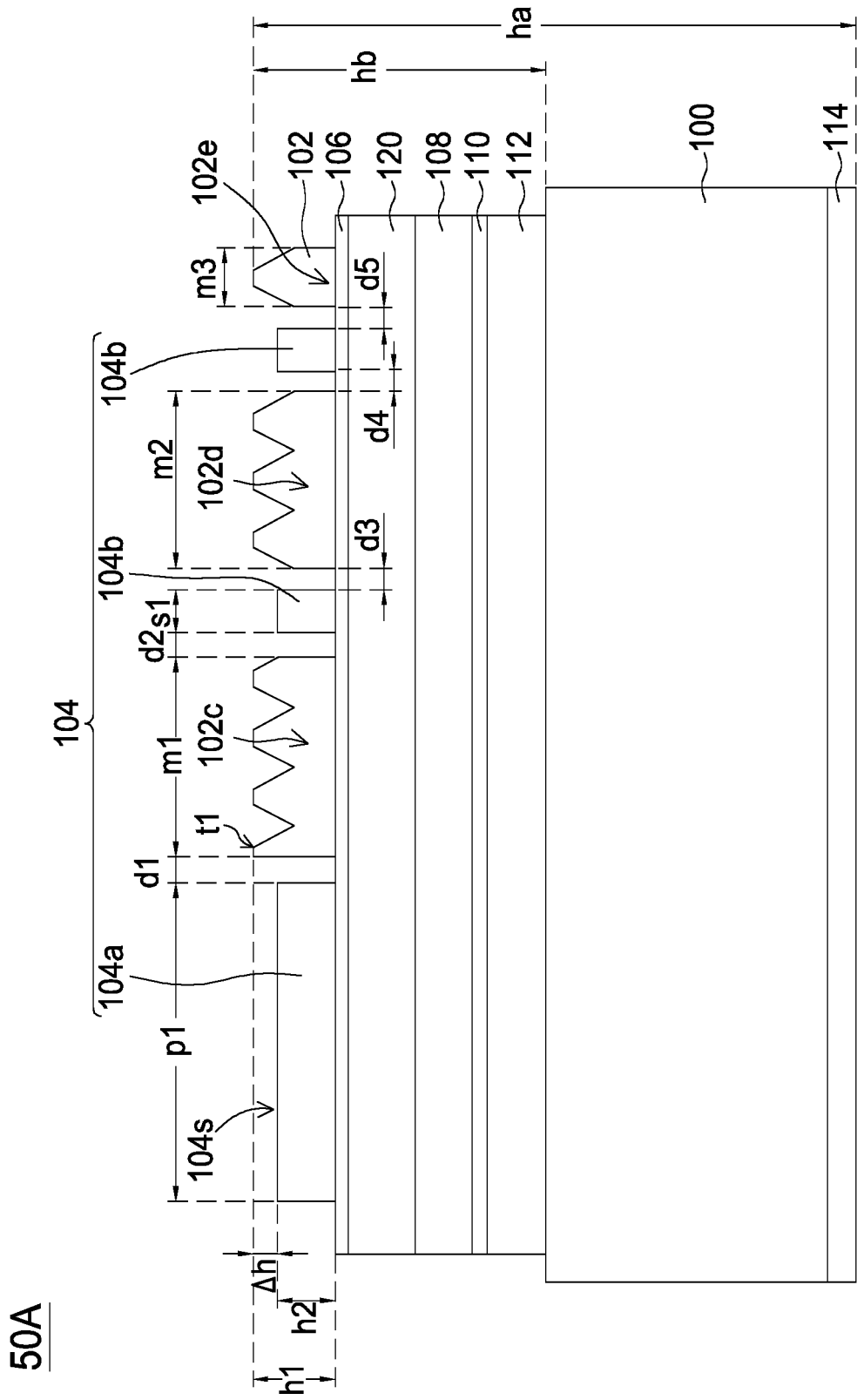
FIG. 5A shows a schematic sectional view of a semiconductor device in accordance with another embodiment of the present disclosure.

FIG. 5A shows a schematic sectional view of a semiconductor device 50A in accordance with another embodiment. In this embodiment, the semiconductor device further includes an intermediate layer 120 between the second semiconductor layer 106 and the third semiconductor layer 108. The intermediate layer 120 physically contacts the second semiconductor layer 106 and may be served as a window layer (or light extraction layer) or a current spreading layer for elevating the light-emitting power. The intermediate layer 120 and the third semiconductor layer 108 may have the same conductivity type. The intermediate layer 120 may include a transparent conductive material as mentioned above.

In addition, a portion of the extension electrode 104b in the semiconductor device 50A may also physically connect to the first semiconductor layer 102. Specifically, the embodiments corresponding to FIG. 2A to FIG. 3C can be referred to for details. On the other hand, in some embodiments, the semiconductor device 50A may include the above-mentioned reflective structure 116, bonding structure 118, and intermediate layer 120 at the same time. The reflective structure 116 may be adjacent to the bonding structure 118. The reflective structure 116 and the bonding structure 118 may be located between the fourth semiconductor layer 112 and the substrate 100. The intermediate layer 120 may be adjacent to the second semiconductor layer 106 and cover on an upper surface of the third semiconductor layer 108.

In order to avoid redundancy, positions, compositions or material of other layers or structures in the embodiment that have already been mentioned in previous embodiments are not repeatedly described.

Figure 5B:
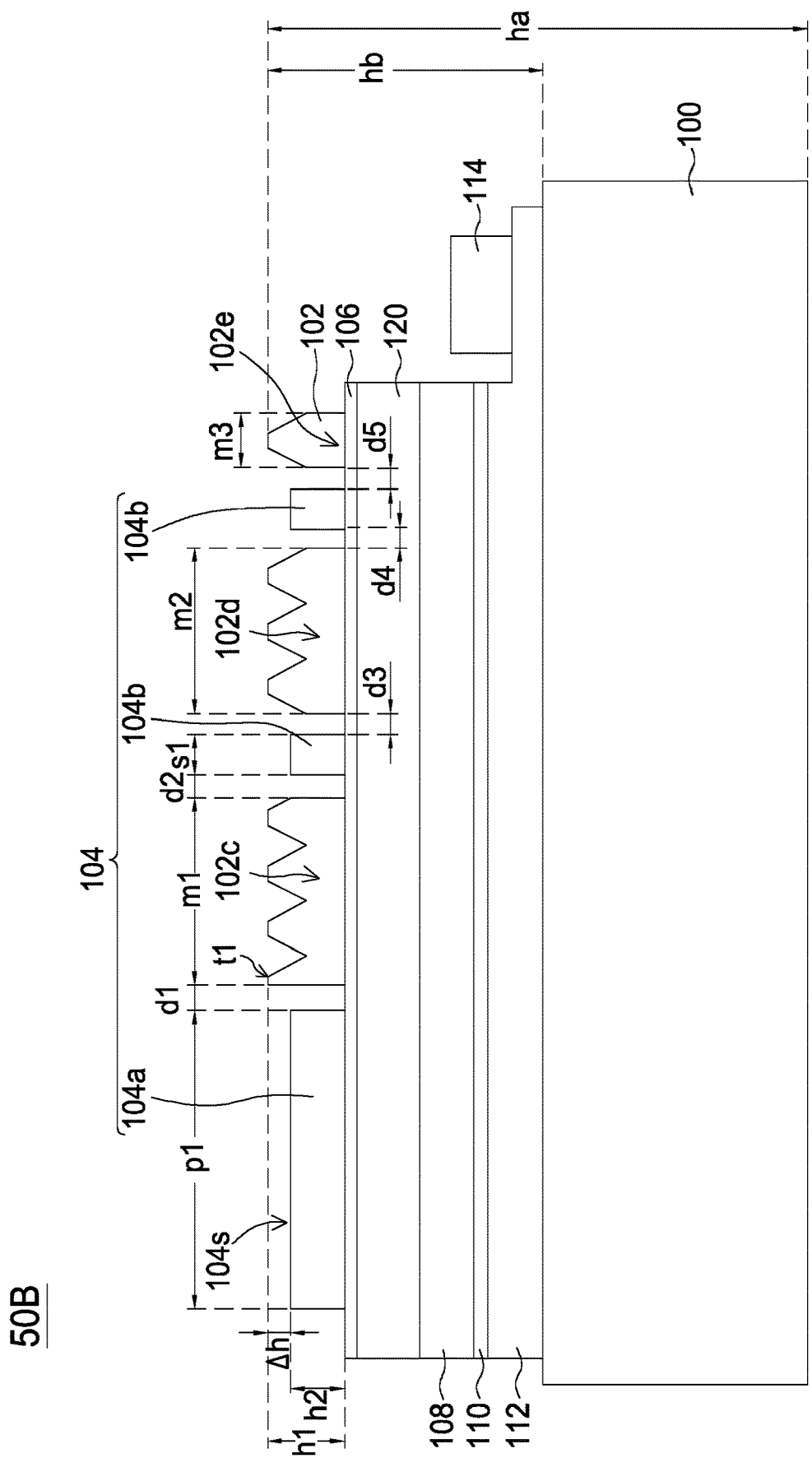
FIG. 5B shows a schematic sectional view of a semiconductor device in accordance with another embodiment of the present disclosure.

FIG. 5B shows a schematic sectional view of a semiconductor device 50B in accordance with another embodiment. The semiconductor device 50B includes a substrate 100, a first semiconductor layer 102, a second semiconductor layer 106, a third semiconductor layer 108, a light-emitting structure 110, and a fourth semiconductor layer 112. The semiconductor device 50B is a horizontal device, which includes a first electrode 104 and a second electrode 114 on the same side of the substrate 100. The first electrode 104 may be on the second semiconductor layer 106, and the second electrode 114 may be on the fourth semiconductor layer 112. Since the semiconductor device 50B is a horizontal device, the substrate 100 may include a non-conductive material, such as sapphire or the conductive material as mentioned above. In this embodiment, the upper surface 114s of the second electrode 114 is lower than the upper surface 104s of the first electrode 104. However, the present disclosure is not limited thereto. The upper surface 114s of the second electrode 114 and the upper surface 104s of the first electrode 104 may also be arranged at approximately the same horizontal height. For example, the height difference between the upper surface 114s and the upper surface 104s may be less than 5% of the height of the first electrode 104. The fourth semiconductor layer 112 may have a width larger than a width of the first semiconductor layer 102, the second semiconductor layer 106, the third semiconductor layer 108, or the light-emitting structure 110, and less than the width of a substrate 100.

In an embodiment, the semiconductor device further includes an intermediate layer 120 between the second semiconductor layer 106 and the third semiconductor layer 108. The intermediate layer 120 may physically contact the second semiconductor layer 106 and may be served as a window layer (or light extraction layer) or a current spreading layer for elevating the light-emitting power. The intermediate layer 120 and the third semiconductor layer 108 may have the same conductivity type. The intermediate layer 120 may include the transparent conductive material as mentioned above. However, the present disclosure is not limited thereto. In some embodiments, the intermediate layer 120 may be omitted and the second semiconductor layer 106 physically contacts the third semiconductor layer 108.

Furthermore, a portion of the extension electrode 104b in the semiconductor device 50B may physically connect to the first semiconductor layer 102. Specifically, the embodiments corresponding to FIG. 2A to FIG. 3C can be referred to for details. On the other hand, in some embodiments, the semiconductor device 50B may include a bonding structure (not shown) between the fourth semiconductor layer 112 and the substrate 100. The bonding structure may physically contact the fourth semiconductor layer 112 and the substrate 100 and bond the substrate 100 to the fourth semiconductor layer 112. In an embodiment, a reflective structure (not shown) may be arranged between the fourth semiconductor layer 112 and the substrate 100 to reflect the light emitted from the light-emitting structure 110 towards the first electrode 104, or arranged on the second semiconductor layer 106 to reflect the light emitted from the light-emitting structure 110 towards the substrate 100 and exit out from the semiconductor device. In an embodiment, the reflective structure may at least cover on the first semiconductor layer 102, and on a portion of the second semiconductor layer 106 that is not covered by the first semiconductor layer 102 or the first electrode 104. The reflective structure may be a conductive structure or an insulating structure. In an embodiment, the reflective structure includes a DBR structure.

In order to avoid redundancy, positions, compositions or material of other layers or structures in the embodiment that have already been mentioned in previous embodiments are not repeatedly described.

Figure 6A:
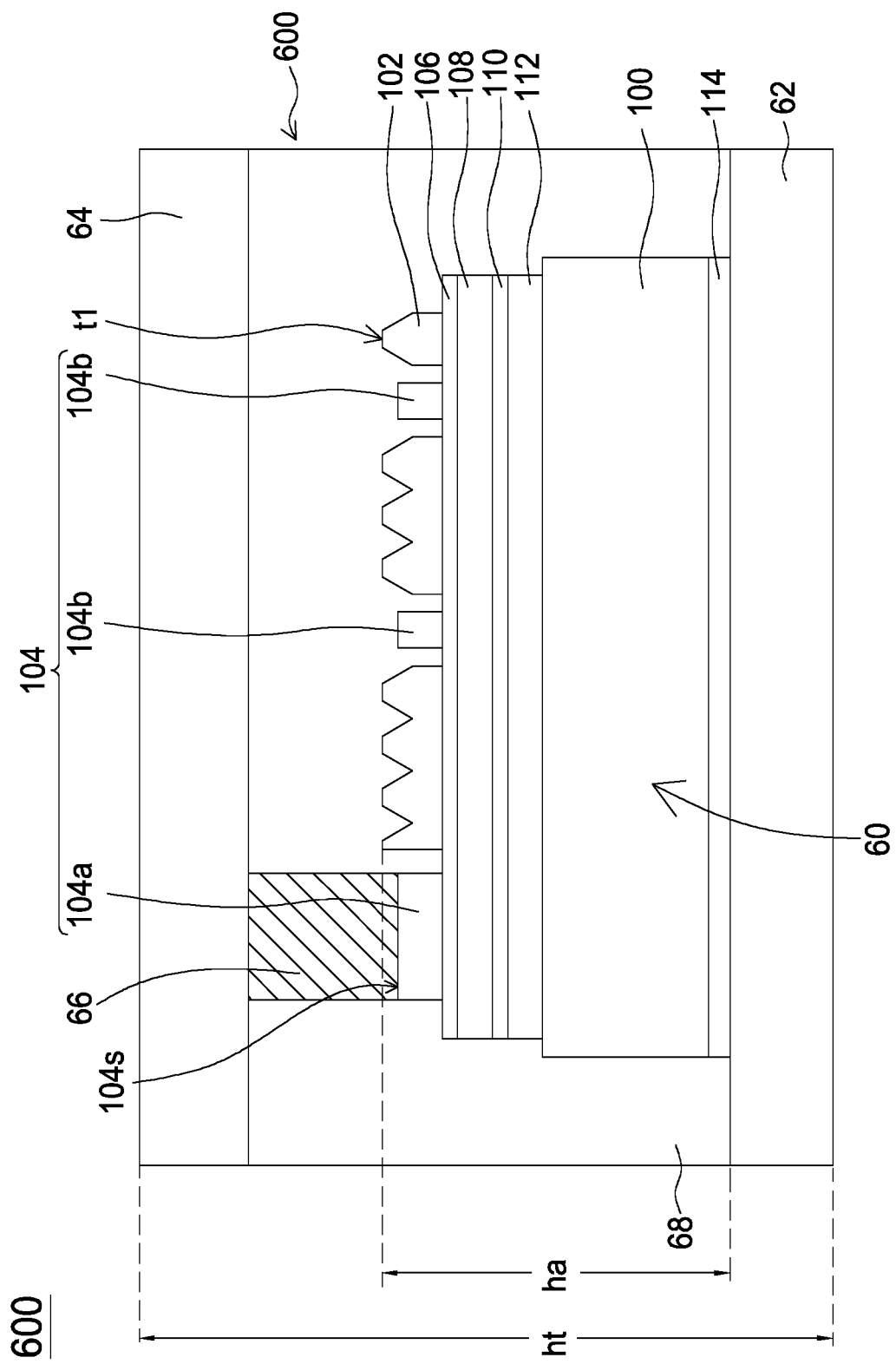
FIG. 6A shows a schematic sectional view of a semiconductor package structure in accordance with an embodiment of the present disclosure.

FIG. 6A shows a schematic sectional view of a semiconductor package structure 600 in accordance with an embodiment. The semiconductor package structure 600 may include a semiconductor device 60, a carrier 62, a cover plate 64, a first conductive structure 66, and a package material 68. The semiconductor device 60 is located between the carrier 62 and the cover plate 64. In the embodiment, the semiconductor device 60 has a structure the same as the semiconductor device 10 shown in FIG. 1B. Specifically, the semiconductor device 60 may have a structure as mentioned in above embodiments (for example, the structure of the semiconductor device 10, the semiconductor device 10', the semiconductor device 20, the semiconductor device 30, the semiconductor device 40, or the semiconductor device 50A as shown in FIG. 1A to FIG. 5A). In order to avoid redundancy, the detailed components or compositions of the semiconductor device 60 are not described repeatedly herein, and the previous embodiments can be referred to for details.

As shown in FIG. 6A, the upper surface 104s of the first electrode 104 may be lower than the first end portion t1 of the first semiconductor layer 102. A first conductive structure 66 may be further provided between the first electrode 104 and the cover plate 64. The first conductive structure 66 may include metal, alloy or a transparent conductive material. The metal may be selected from Au, Ag, Cu, Cr, Al, Pt, Ni, Ti, or Sn. The alloy may include at least two metal elements selected from Au, Ag, Cu, Cr, Al, Pt, Ni, Ti, and Sn. Regarding the transparent conductive material, above embodiments can be referred to. In this embodiment, the first conductive structure 66 is located between the main electrode 104a and the cover plate 64. The second electrode 114 may electrically connect to and may physically contact the carrier 62. In another embodiment, a conductive structure (not shown) may be provided between the second electrode 114 and the carrier 62. Or, the conductive structure (not shown) may be provided between the extension electrode 104b and the cover plate 64.

In an embodiment, the carrier 62 may include a base material having a conductive line (e.g. a printed circuit board; PCB). The base material may include ceramic or glass. In an embodiment, the semiconductor device 60 is a light-emitting diode. In an embodiment, the package material 68 may include an opaque gel (e.g. a black gel) or a reflective material (e.g. a white gel) for reducing cross talks between devices during operation. In an embodiment, the cover plate 64 also has a conductive line (not shown) for forming an electrical connection with the first conductive structure 66, and the cover plate 64 may include a material (such as glass) which allows transmission of the light emitted from the semiconductor device 60. The conductive line may be formed of or include metal, alloy, or a transparent conductive material. For specific material examples, the above-mentioned embodiments can be referred to, thus are not described repeatedly herein. In an embodiment, a height ht of the package structure 600 fulfills 300 µm≤ht≤3 mm. For example, the height ht may be approximately 450 µm, 600 µm, 800 µm, 1 mm, 1.5 mm, 2 mm, 2.5 mm, or 2.8 mm. In an embodiment, the height ha of the semiconductor device 60 fulfills 100 µm≤ha≤250 µm. For example, ha may be 130 µm, 150 µm, 170 µm, 200 µm, or 230 µm. In an embodiment, the height ht of the package structure 600 and the height ha of the semiconductor device 60 fulfills 1<ht/ha≤15. For example, ht/ha may be approximately 3, 4, 5, 6, 7, 8, 9, 10, 11, 12, 13, or 14.

Figure 6B:
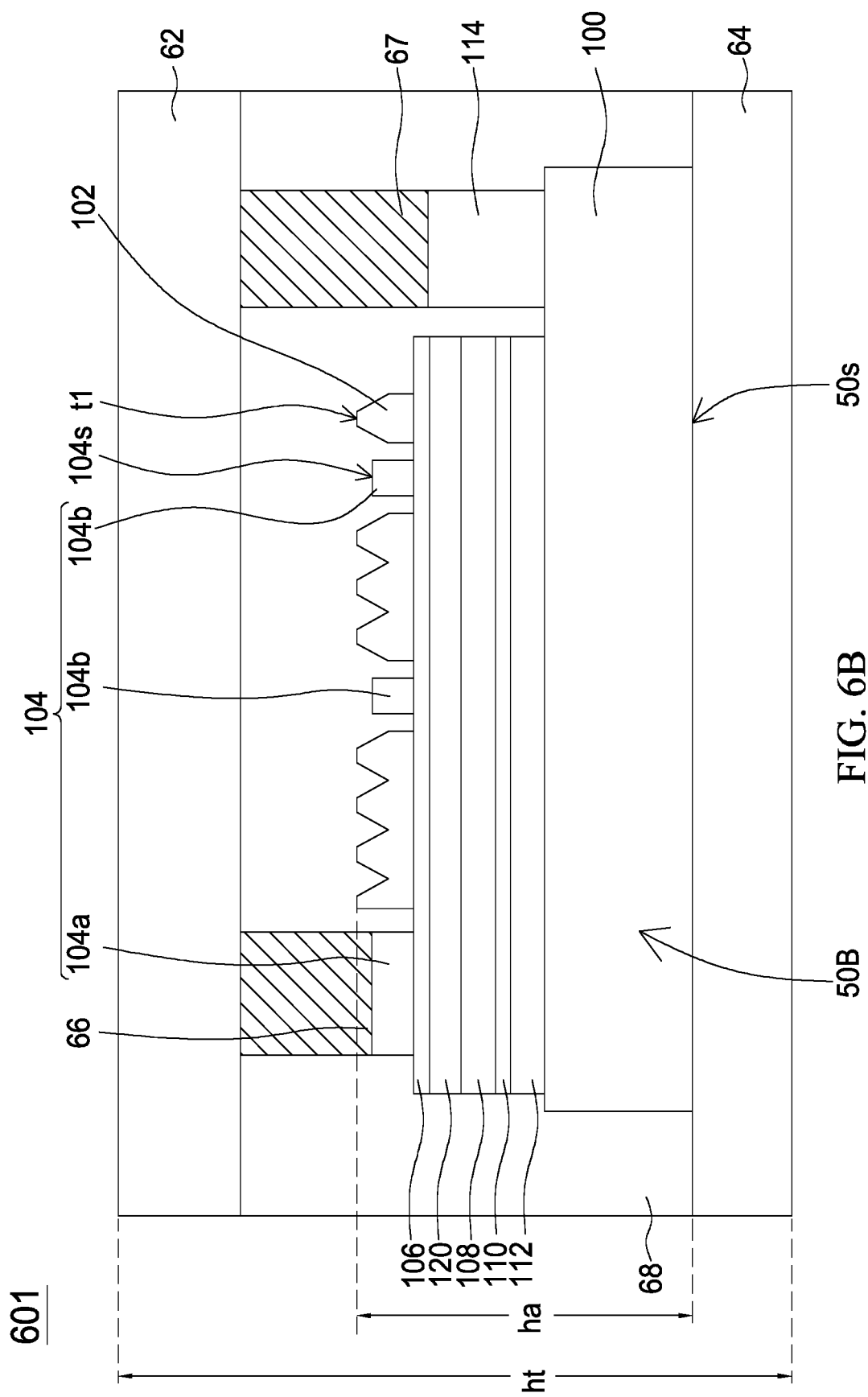
FIG. 6B shows a schematic sectional view of a semiconductor package structure in accordance with another embodiment of the present disclosure.

FIG. 6B shows a schematic sectional view of a semiconductor package structure 601 in accordance with an embodiment. The semiconductor package structure 601 may include a semiconductor device 50B, a carrier 62, a cover plate 64, a first conductive structure 66 and a package material 68. In this embodiment, the semiconductor device 50B is located between the carrier 62 and the cover plate 64. Regarding the positions, compositions or material of other layers or structures, the previous embodiments corresponding to FIG. 5B can be referred to for details, thus are not described repeatedly herein.

In this embodiment, the first electrode 104 and the second electrode 114 are on the same side of the substrate 100. A first conductive structure 66 may be provided between the first electrode 104 and the carrier 62, and a second conductive structure 67 may be provided between the second electrode 114 and the carrier 62. The first conductive structure 66 and the second conductive structure 67 may include the same material, such as metal, alloy or a transparent conductive material. For specific material examples, the above-mentioned embodiments can be referred to, thus are not described repeatedly herein. In an embodiment, the carrier 62 may include a base material having a conductive line (not shown), for example, a printed circuit board (PCB). The base material may include ceramic or glass. The carrier 62 and the semiconductor device 50B may electrically connect with each other through the first conductive structure 66, the second conductive structure 67 and the conductive line. In an embodiment, the semiconductor device 50B is a light-emitting diode. In an embodiment, the package material 68 may include an opaque gel (e.g. a black gel) or a reflective material (e.g. a white gel) for reducing cross talks between devices during operation. In an embodiment, the cover plate 64 may include a material (such as glass) which allows transmission of the light emitted from the semiconductor device 50B. In this embodiment, the semiconductor device 50B has a main light emission surface 50s on a side of the substrate opposite to the first electrode 104 and the second electrode 114, and the cover plate 64 may be on the main light emission surface 50s of the semiconductor device 50B. In this embodiment, the semiconductor device 50B is packaged in a flip-chip form. In an embodiment, the cover plate 64 and the semiconductor device 50B do not form an electrical connection. Regarding the positions, compositions or material of other layers or structures of this embodiment, previous embodiments can be referred to for details, thus are not described repeatedly herein.

Figure 7A:
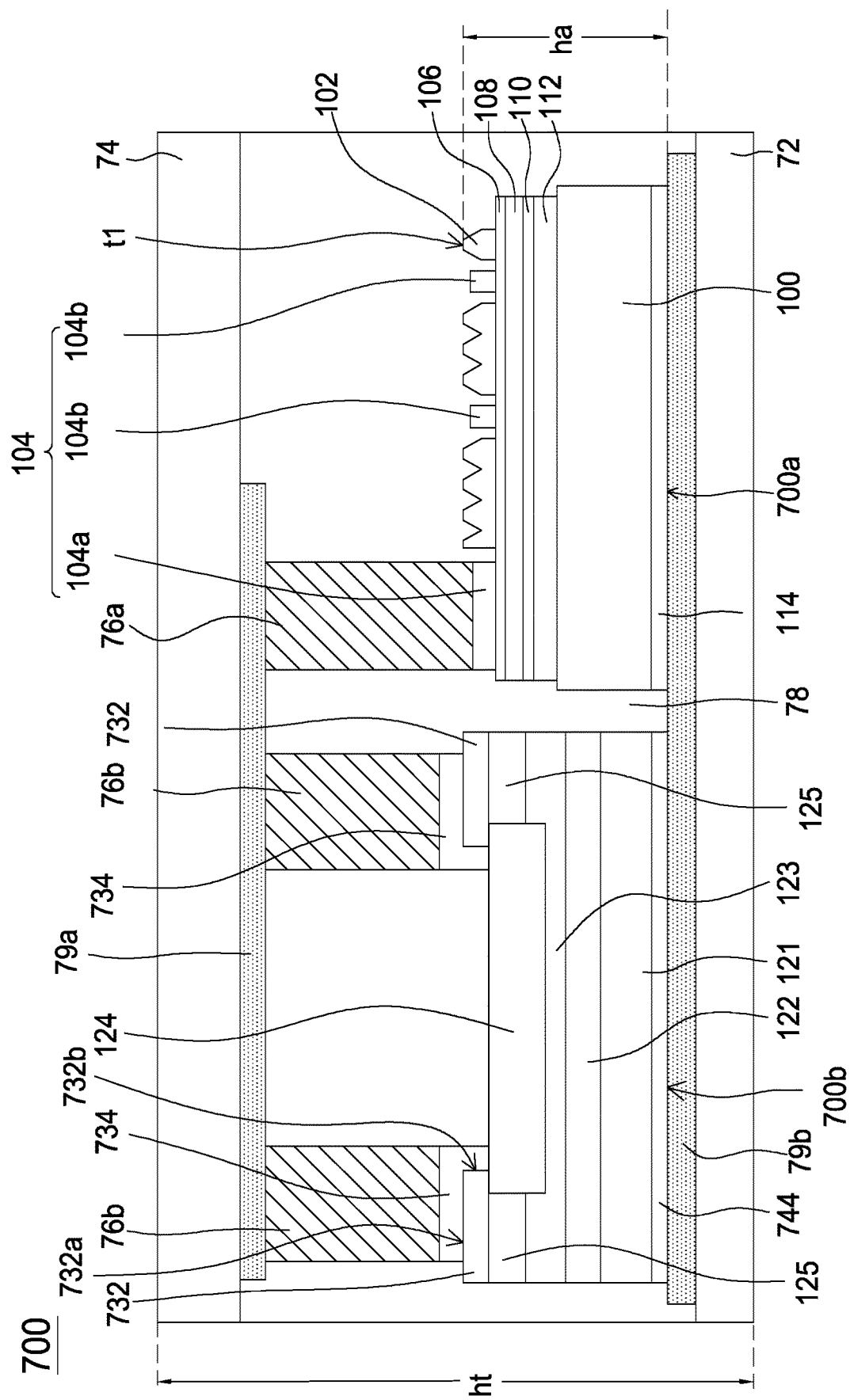
FIG. 7A shows a schematic sectional view of a semiconductor package structure in accordance with an embodiment of the present disclosure.

FIG. 7A shows a schematic sectional view of a semiconductor package structure in accordance with an embodiment. The embodiment provides an optical detection system which includes a package structure 700. The package structure 700 may include a first semiconductor device 700a, a second semiconductor device 700b, a carrier 72, a cover plate 74, a third conductive structure 76a, a fourth conductive structure 76b, a package material 78, a first conductive line 79a, and a second conductive line 79b. In this embodiment, the first semiconductor device 700a and the second semiconductor device 700b are located between the carrier 72 and the cover plate 74. In this embodiment, the first semiconductor device 700a has a structure the same as the semiconductor device 10 shown in FIG. 1B. Specifically, the first semiconductor device 700a may have a structure as that mentioned in above embodiments (for example, the structure of the semiconductor device 10, the semiconductor device 10', the semiconductor device 20, the semiconductor device 30, the semiconductor device 40 or the semiconductor device 50A as shown in FIG. 1A to FIG. 5A). In order to avoid redundancy, the detailed components or compositions of the semiconductor device 60 are not described repeatedly herein, and the previous embodiments can be referred to for details. The first conductive line 79a and the second conductive line 79b may be used for electrically connecting the first semiconductor device 700a and the second semiconductor device 700b. Specifically, the first conductive line 79a and the second conductive line 79b may be on the carrier 72 and the cover plate 74, respectively. The third conductive structure 76a may be located between the first semiconductor device 700a and the first conductive line 79a, and the fourth conductive structure 76b may be located between the second semiconductor device 700b and the first conductive line 79a. In this embodiment, the second conductive line 79b physically contacts the first semiconductor device 700a and the second semiconductor device 700b, and the first conductive line 79a electrically connects the first semiconductor device 700a and the second semiconductor device 700b through the third conductive structure 76a and the fourth conductive structure 76b. The first conductive line 79a and the second conductive line 79b may include the same material, such as metal, alloy or a transparent conductive material. For specific material examples, the above-mentioned embodiments can be referred to, thus are not described repeatedly herein.

The first semiconductor device 700a can be a light-emitting diode, and the second semiconductor device 700b can be an optical detector or a light detector (such as a photodiode). For example, the second semiconductor device 700b may be a PIN type photodiode. The second semiconductor device 700b may include a substrate 121, a fifth semiconductor layer 122, a sixth semiconductor layer 123, a seventh semiconductor layer 124, an eighth semiconductor layer 125, a dielectric layer 732, a third electrode 734 and a fourth electrode 744. In an embodiment, the substrate 121 may contain a conductive material, such as GaAs, InP or Si. In this embodiment, the fifth semiconductor layer 122 is on the substrate 121, and the sixth semiconductor layer 123 is on the fifth semiconductor layer 122. The seventh semiconductor layer 124 may be adjacent to the sixth semiconductor layer 123. The eighth semiconductor layer 125 may be adjacent to the sixth semiconductor layer 123 and the seventh semiconductor layer 124, and may be located between the dielectric layer 732 and the sixth semiconductor layer 123. In this embodiment, the seventh semiconductor layer 124 has a width less than a width of the sixth semiconductor layer 123. The eighth semiconductor layer 125 has a width less than a width of the dielectric layer 732.

As shown in FIG. 7A, the sixth semiconductor layer 123 may be located under and physically contact the seventh semiconductor layer 124 and the eighth semiconductor layer 125. The dielectric layer 732 may be on the seventh semiconductor layer 124 and the eighth semiconductor layer 125, and may physically contact an upper surface of the seventh semiconductor layer 124 and an upper surface of the eighth semiconductor layer 125. The third electrode 734 may electrically connect to the seventh semiconductor layer 124, and may cover at least a portion of the upper surface 732a and a side wall 732b of the dielectric layer 732. The fourth electrode 744 is located under the substrate 121 and may electrically connect to the substrate 121 and the fifth semiconductor layer 122. In this embodiment, both the first semiconductor device 700a and the second semiconductor device 700b have vertical semiconductor structures.

In an embodiment, the fifth semiconductor layer 122 and the seventh semiconductor layer 124 are of different conductivity types and are respectively an n-type semiconductor and a p-type semiconductor. For example, the fifth semiconductor layer 122 can be an n-type semiconductor, and the seventh semiconductor layer 124 can be a p-type semiconductor. The sixth semiconductor layer 123 may be an undoped or intrinsic (i-type) semiconductor. The eighth semiconductor layer 125 and the fifth semiconductor layer 122 may have the same conductivity type. For example, the eighth semiconductor layer 125 may be an n-type semiconductor. The fifth semiconductor layer 122 and the seventh semiconductor layer 124 may include the same material. The fifth semiconductor layer 122 and the seventh semiconductor layer 124 may respectively include a III-V group semiconductor material. In an embodiment, the fifth semiconductor layer 122 and the seventh semiconductor layer 124 may respectively include Al, Ga, As, P, In or N. For example, the fifth semiconductor layer 122 and the seventh semiconductor layer 124 may respectively include a binary or ternary semiconductor material, such as InP, InGaAs or InGaP. In an embodiment, the fifth semiconductor layer 122 and the seventh semiconductor layer 124 may not contain N. In an embodiment, the fifth semiconductor layer 122 or the seventh semiconductor layer 124 only includes a binary semiconductor material such as InP, or only includes a ternary semiconductor material (such as InGaAs or InGaP). The fifth semiconductor layer 122 and the seventh semiconductor layer 124 may be respectively doped with a dopant (such as Zn or Si) to obtain appropriate conductivity types. The sixth semiconductor layer 123 may include an undoped III-V group semiconductor material, for example, a ternary semiconductor material (such as InGaAs or InGaP). In some embodiments, the sixth semiconductor layer 123 only includes the ternary semiconductor material (such as InGaAs or InGaP). In addition, the dielectric layer 732 may include an insulating material, such as SiNx or SiOx (x=1.5 or 2). The eighth semiconductor layer 125 and the seventh semiconductor layer 124 may include the same material, for example, a binary or ternary semiconductor material, such as InP, InGaAs or InGaP. The eighth semiconductor layer 125 and the seventh semiconductor layer 124 may have different conductivity types. For example, the seventh semiconductor layer 124 may be a p-type semiconductor and the eighth semiconductor layer 125 may be an n-type semiconductor. In an embodiment, the eighth semiconductor layer 125 and the fifth semiconductor layer 122 include the same dopant. In an embodiment, the eighth semiconductor layer 125 may be doped with a dopant (such as Zn or Si) to obtain an appropriate conductivity type. In an embodiment, the eighth semiconductor layer 125 is originally an n-type semiconductor, and a diffusion process is conducted to transform the conductivity type of eighth semiconductor layer 125 and a region of the sixth semiconductor layer 123 into p type (specifically, the region corresponds to the seventh semiconductor layer 124). The material of the third electrode 734 and the fourth electrode 744 may be the same or different. The third electrode 734 and the fourth electrode 744 may respectively include metal oxide, metal or alloy. For specific material examples, the description regarding the first electrode 104 and the second electrode 114 in above embodiments can be referred to, thus are not described repeatedly herein.

The first semiconductor device 700a and the second semiconductor device 700b may form an anti-parallel connection. In an embodiment, the fifth semiconductor layer 122 is n type, the seventh semiconductor layer 124 is p type, the third semiconductor layer 108 is n type, the fourth semiconductor layer 112 is p type, the sixth semiconductor layer 123 is i type and the eighth semiconductor layer 125 is n type.

The first electrode 104 may have an upper surface lower than the first end portion t1 of the first semiconductor layer 102. A third conductive structure 76a may be provided between the first electrode 104 and the cover plate 74, and a fourth conductive structure 76b may be provided between the third electrode 734 and the cover plate 74. The third conductive structure 76a and the fourth conductive structure 76b may include the same material, such as metal, alloy or a transparent conductive material. For specific material examples, the above-mentioned embodiments can be referred to, thus are not described repeatedly herein. In this embodiment, the second electrode 114 and the fourth electrode 744 electrically connect to the carrier 72, and may physically contact the carrier 72.

In an embodiment, the first semiconductor device 700a may emit a light having a wavelength in a range of 800 nm to 3000 nm, and the second semiconductor device 700b may absorb the light having a wavelength in a range of 800 nm to 3000 nm, for example, approximately 810 nm, 850 nm, 910 nm, 940 nm, 1050 nm, 1070 nm, 1100 nm, 1200 nm, 1300 nm, 1400 nm, 1450 nm, 1550 nm, 1600 nm, 1650 nm, or 1700 nm.

In an embodiment, the carrier 72 may include a base material having a conductive line such as PCB. The base material may include ceramic or glass. In an embodiment, the cover plate 74 may include a material (such as glass) which allows transmission of the light emitted from the semiconductor device 700a. In an embodiment, a wall structure (not shown) may be further provided between the first semiconductor device 700a and the second semiconductor device 700b to avoid direct absorption of the light emitted from the first semiconductor device 700a by the second semiconductor device 700b.

In an embodiment, the package structure 700 may include three or more semiconductor devices and each semiconductor device may have the same or different structures. In an embodiment, the package structure 700 may include one optical detector and two or more light-emitting diodes. The light-emitting diodes may respectively emit light with different wavelength ranges. For example, each light-emitting diode may emit red light or infrared light. The optical detector may detect light having different wavelength ranges at the same time. In an embodiment, each semiconductor device may be independently controlled by a circuit. In an embodiment, any two of the semiconductor devices have a common electrode (i.e. a shared electrode).

In order to avoid redundancy, positions, compositions or material of other layers or structures in the embodiment that have already been mentioned in previous embodiments are not repeatedly described.

Figure 7B:
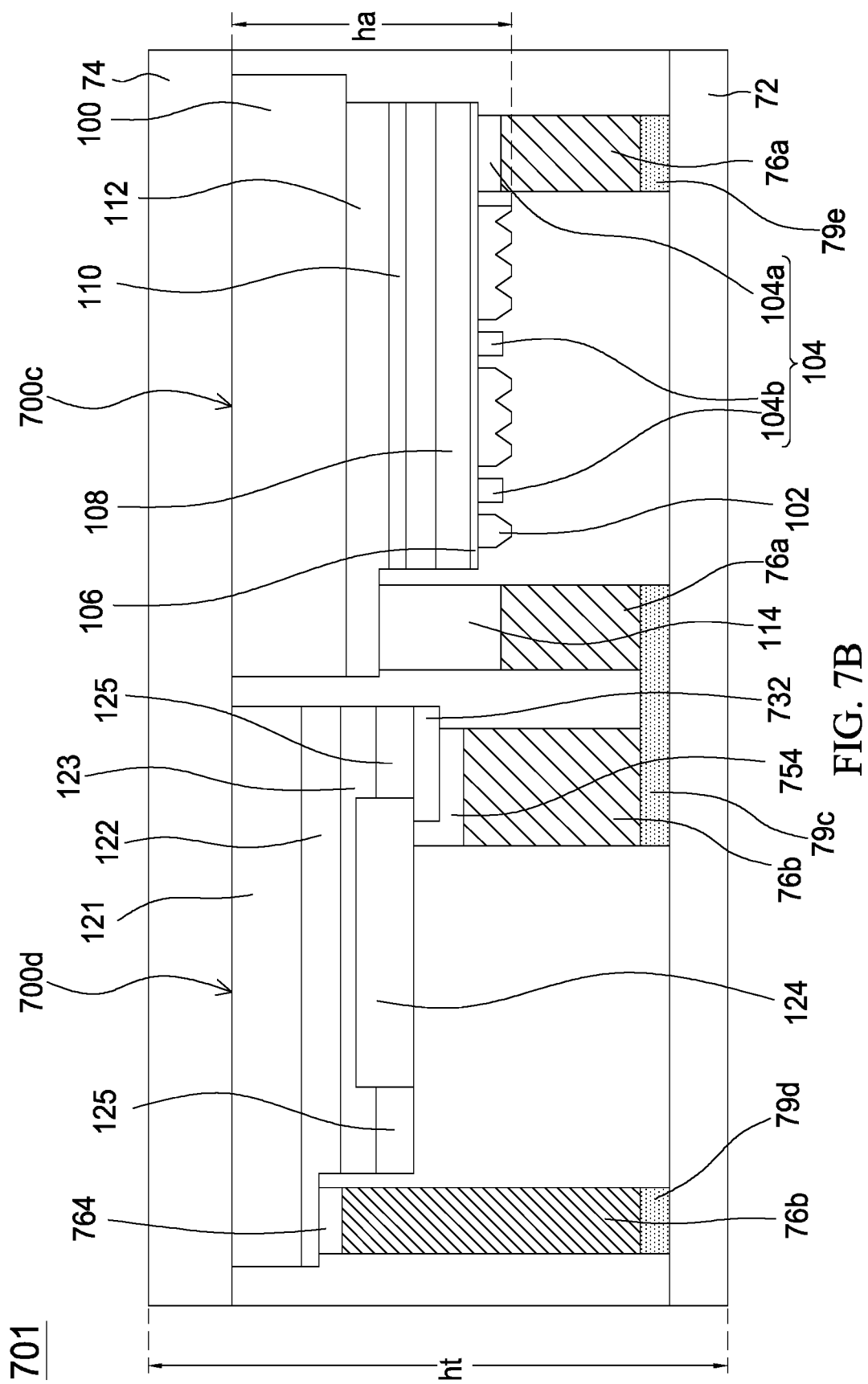
FIG. 7B shows a schematic sectional view of a semiconductor package structure in accordance with another embodiment of the present disclosure.

FIG. 7B shows a schematic sectional view of a semiconductor package structure in accordance with an embodiment.

The embodiment provides an optical detection system including a package structure 701. The package structure 701 may include a third semiconductor device 700c, a fourth semiconductor device 700d, a carrier 72, a cover plate 74, a third conductive structures 76a, a fourth conductive structure 76b, a package material 78, a third conductive line 79c, a fourth conductive line 79d, and a fifth conductive line 79e. In this embodiment, the third semiconductor device 700c and the fourth semiconductor device 700d are located between the carrier 72 and the cover plate 74. The third semiconductor device 700c may be a light-emitting diode, and the light emitted from the third semiconductor device 700c can pass through the cover plate 74. The main light emission surface 50s of the third semiconductor device 700c may be the surface facing the cover plate 74. As shown in FIG. 7B, the third semiconductor device 700c may have the same structure as the semiconductor device 50B shown in FIG. 5B.

In order to avoid redundancy, positions, compositions or material of other layers or structures in the embodiment that have already been mentioned in previous embodiments are not repeatedly described.

The fourth semiconductor device 700d may be an optical detector (such as a photodiode). For example, the fourth semiconductor device 700d may be a PIN type photodiode. The fourth semiconductor device 700d may include a substrate 121, a fifth semiconductor layer 122, a sixth semiconductor layer 123, a seventh semiconductor layer 124, an eighth semiconductor layer 125, a dielectric layer 732, a fifth electrode 754 and a sixth electrode 764. As shown in FIG. 7B, in this embodiment, the fifth electrode 754 physically contacts the seventh semiconductor layer 124, and the sixth electrode 764 is on the fifth semiconductor layer 122 and physically contacts the fifth semiconductor layer 122. The eighth semiconductor layer 125 near a side of the fifth electrode 754 may be located between the dielectric layer 732 and the sixth semiconductor layer 123. The dielectric layer 732 may be located between the fifth electrode 754 and the eighth semiconductor layer 125, and a portion of the dielectric layer 732d may physically contact the seventh semiconductor layer 124. In this embodiment, the fifth semiconductor layer may have a width larger than a width of the sixth semiconductor layer 123. Regarding material or production processes of the substrate 121, the fifth semiconductor layer 122, the sixth semiconductor layer 123, the seventh semiconductor layer 124, the eighth semiconductor layer 125, the dielectric layer 732, above-mentioned embodiments can be referred to for details, thus are not described repeatedly herein. The material of the fifth electrode 754 and the sixth electrode 764 may have the same or different. The fifth electrode 754 and the sixth electrode 764 may include metal oxide, metal or alloy. For specific material examples, the description regarding the first electrode 104 and the second electrode 114 in above embodiments can be referred to, thus are not described repeatedly herein.

To be specific, the difference between the fourth semiconductor device 700d and the second semiconductor device 700b as shown in FIG. 7A is in arrangement of electrodes. The third semiconductor device 700c and the fourth semiconductor device 700d are both horizontal devices and are both fixed on the carrier 72 in a flip-chip form. As shown in FIG. 7B, the fifth electrode 754 and the sixth electrode 764 are on the same side of the substrate 121. In contrast, the second semiconductor device 700b in FIG. 7A includes the third electrode 734 and the fourth electrode 744 respectively on two sides of the substrate 121. As shown in FIG. 7B, the fifth electrode 754 may be on the dielectric layer 732 and electrically connect to the seventh semiconductor layer 124. The sixth electrode 764 may be on and electrically connect to the fifth semiconductor layer 122. The third semiconductor device 700c and the fourth semiconductor device 700d may form an anti-parallel connection.

In the package structure 701, the third conductive line 79c, the fourth conductive line 79d, and the fifth conductive line 79e may be further provided between the third semiconductor device 700c or the fourth semiconductor device 700d and the carrier 72. The third conductive line 79c, the fourth conductive line 79d, and the fifth conductive line 79e may be used for electrically connecting the third semiconductor device 700c and/or the fourth semiconductor device 700d. In this embodiment, the third conductive line 79c, the fourth conductive line 79d, and the fifth conductive line 79e are all on the carrier 72, and may electrically connect the first semiconductor device 700a and the second semiconductor device 700b through the third conductive structure 76a and the fourth conductive structure 76b. To be specific, the third conductive line 79c may connect to the third conductive structure 76a which contacts the second electrode 114 and the fourth conductive structure 76b which contacts the fifth electrode 754, thereby electrically connecting to the second electrode 114 and the fifth electrode 754. The fourth conductive line 79d may electrically connect to the sixth electrode 764 through the fourth conductive structure 76b which contacts the sixth electrode 764. The fifth conductive line 79e may electrically connect to the first electrode 104 through the third conductive structure 76a which contacts the first electrode 104. The third conductive line 79c, the fourth conductive line 79d, and the fifth conductive line 79e may include the same material, for example, metal, alloy or a transparent conductive material. For specific material examples, the above-mentioned embodiments can be referred to, thus are not described repeatedly herein. In an embodiment, the third semiconductor device 700c and/or the fourth semiconductor device 700d do not electrically connect to the cover plate 74.

In order to avoid redundancy, positions, compositions or material of other layers or structures in the embodiment that have already been mentioned in previous embodiments and are not repeatedly described.

Furthermore, in an embodiment, an optical detection system is provided, which may include the first semiconductor device 700a as shown in FIG. 7A and the fourth semiconductor device 700d as shown in FIG. 7B. In another embodiment, an optical detection system which includes the third semiconductor device 700c as shown in FIG. 7B and the second semiconductor device 700b as shown in FIG. 7A is provided.

Based on above, the present disclosure can provide a semiconductor device suitable for use in a miniaturized package, and by adopting the device, the size of the package may be further reduced, and it may be beneficial to the integration and miniaturization of integrated circuit (IC) components.

The semiconductor device or the semiconductor package structure of the present disclosure can be applied to products in various fields, such as illumination, medical care, display, communication, sensing, or power supply system. For example, a light fixture, monitor, mobile phone, or tablet, an automotive instrument panel, a television, computer, wearable device (such as watch, bracelet or necklace), traffic sign, outdoor display device, or medical device.

It should be realized that each of the embodiments mentioned in the present disclosure is only used for describing the present disclosure, but not for limiting the scope of the present disclosure. Any obvious modification or alteration is not departing from the spirit and scope of the present disclosure. Furthermore, above-mentioned embodiments can be combined or substituted under proper condition and are not limited to specific embodiments described above. A connection relationship between a specific component and another component specifically described in an embodiment may also be applied in another embodiment and is within the scope as claimed in the present disclosure.

What is claimed is:

1. A semiconductor device, comprising:
a substrate;
a light-emitting structure on the substrate;
a first semiconductor layer on the light-emitting structure;
a second semiconductor layer between the first semiconductor layer and the light-emitting structure;
a first electrode physically contacting and located on the second semiconductor layer; and
an insulating layer between the first electrode and the first semiconductor layer;
wherein a portion of the first electrode is separated from the first semiconductor layer, and the first semiconductor layer has a first thickness and the second semiconductor layer has a second thickness less than the first thickness.

2. The semiconductor device of claim 1, wherein the first semiconductor layer has a first end portion, and the first electrode has an upper surface lower than the first end portion.

3. The semiconductor device of claim 1, wherein in a top view of the semiconductor device, the first electrode includes a main electrode and a plurality of extension electrodes.

4. The semiconductor device of claim 3, wherein in a sectional view of the semiconductor device, the first semiconductor layer includes a plurality of portions, and each extension electrode is between two adjacent portions.

5. The semiconductor device of claim 3, wherein the main electrode and the plurality of extension electrodes physically contact the second semiconductor layer.

6. The semiconductor device of claim 1, wherein the first semiconductor layer has a roughened surface.

7. The semiconductor device of claim 1, wherein the first electrode does not physically contact the first semiconductor layer.

8. A semiconductor package structure, comprising:
a carrier;
a cover plate on the carrier;
a semiconductor device between the carrier and the cover plate, comprising:
a substrate;
a light-emitting structure on the substrate;
a first semiconductor layer on the light-emitting structure;
a second semiconductor layer between the first semiconductor layer and the light-emitting structure;
a first electrode physically contacting and located on the second semiconductor layer, wherein a portion of the first electrode is separated from the first semiconductor layer, and the first semiconductor layer has a first thickness and the second semiconductor layer has a second thickness less than the first thickness;
an insulating layer between the first electrode and the first semiconductor layer; and
a package material filled between the carrier, the semiconductor device and the cover plate.

9. The semiconductor package structure of claim 8, further comprising a conductive structure between the cover plate and the semiconductor device.

10. The semiconductor package structure of claim 8, wherein the semiconductor device has a first height ha, the semiconductor package structure has a second height ht, and $1 < ht/ha \leq 15$.

11. A semiconductor package structure, comprising:
a carrier;
a cover plate on the carrier;
a first semiconductor device and a second semiconductor device, located between the carrier and the cover plate; and
a package material filled between the carrier, the first semiconductor device, the second semiconductor device and the cover plate;
wherein the first semiconductor device is the semiconductor device according to claim 1 and the second semiconductor device is an optical detector.

12. The semiconductor package structure of claim 11, further comprising a conductive line electrically connecting the first semiconductor device and the second semiconductor device.

13. The semiconductor package structure of claim 11, wherein the second semiconductor device is a PIN type photodiode.

14. The semiconductor package structure of claim 11, wherein the first semiconductor device and the second semiconductor device form an anti-parallel connection.

15. The semiconductor package structure of claim 11, further comprising a wall structure between the first semiconductor device and the second semiconductor device.

16. The semiconductor device of claim 3, wherein the main electrode is separated from the first semiconductor layer in a horizontal direction, and the plurality of extension electrodes has a first portion which is separated from the first semiconductor layer and a second portion physically connects the first semiconductor layer in the horizontal direction.

17. The semiconductor device of claim 1, further comprising a cover layer on the first semiconductor layer.

18. The semiconductor device of claim 17, wherein the cover layer has an upper edge, the first semiconductor layer has a first end portion, the first electrode has an upper surface, and the upper surface of the first electrode is higher than the first end portion and lower than the upper edge.

19. The semiconductor device of claim 3, wherein the main electrode has a polygonal shape with a round corner in the top view of the semiconductor device.

* * * * *